US012132093B2

(12) United States Patent
Radic et al.

(10) Patent No.: US 12,132,093 B2
(45) Date of Patent: Oct. 29, 2024

(54) BASE SILICIDE ON MONOCRYSTALLINE BASE STRUCTURES

(71) Applicant: NXP USA, INC., Austin, TX (US)

(72) Inventors: Ljubo Radic, Gilbert, AZ (US); Ronald Willem Arnoud Werkman, Groesbeek (NL); James Albert Kirchgessner, Tempe, AZ (US); Jay Paul John, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 220 days.

(21) Appl. No.: 17/805,774

(22) Filed: Jun. 7, 2022

(65) Prior Publication Data

US 2023/0395692 A1    Dec. 7, 2023

(51) Int. Cl.
H01L 29/66    (2006.01)
H01L 29/732   (2006.01)
H01L 29/737   (2006.01)

(52) U.S. Cl.
CPC ...... H01L 29/66242 (2013.01); H01L 29/732 (2013.01); H01L 29/7378 (2013.01)

(58) Field of Classification Search
CPC ......... H01L 29/66242; H01L 29/66318; H01L 29/732; H01L 29/7378
See application file for complete search history.

(56) References Cited

U.S. PATENT DOCUMENTS

| | | | |
|---|---|---|---|
| 5,459,084 A | 10/1995 | Ryum et al. | |
| 7,803,685 B2 | 9/2010 | John et al. | |
| 8,389,372 B2 * | 3/2013 | Dahlstrom | H01L 29/66242 438/312 |
| 8,847,359 B2 * | 9/2014 | Balster | H01L 21/76283 257/E29.174 |
| 2008/0128754 A1 | 6/2008 | Kim et al. | |
| 2014/0175520 A1 | 6/2014 | Fu et al. | |
| 2015/0263108 A1 * | 9/2015 | Donkers | H01L 29/66242 438/316 |
| 2018/0102422 A1 | 4/2018 | Stamper et al. | |
| 2020/0066885 A1 | 2/2020 | Jain et al. | |

FOREIGN PATENT DOCUMENTS

CN    103035686 B    12/2015

OTHER PUBLICATIONS

Donkers, J.J.Y.M., "A Novel Fully Self-Aligned SiGe:C HBT Architecture Featuring a Single-Step Epitaxial Collector-Base Process", 2007 IEEE International Electron Devices Meeting, Dec. 10-12, 2007.

* cited by examiner

*Primary Examiner* — Calvin Y Choi

(57) ABSTRACT

A transistor with an emitter, base, and collector. The base includes a monocrystalline base layer. A sacrificial material is formed on the monocrystalline base layer. The sacrificial material is removed to expose a portion of the monocrystalline base layer. A base silicide includes a portion formed on the portion of the base monocrystalline base layer that was exposed by the removal of the sacrificial material.

20 Claims, 32 Drawing Sheets

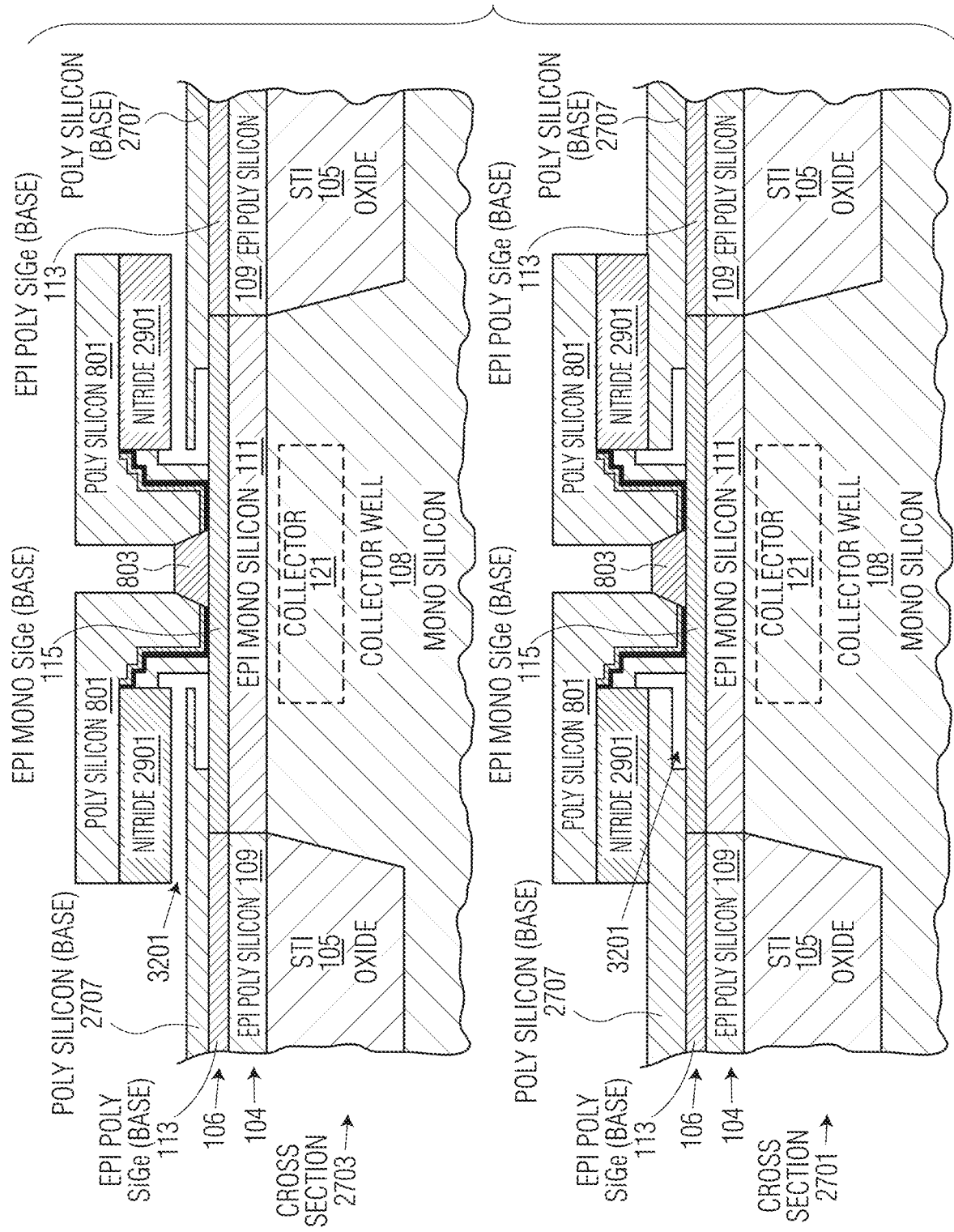

BASE SILICIDE ON MONOCRYSTALLINE BASE STRUCTURES

BACKGROUND OF THE INVENTION

Field of the Invention

This invention relates in general to transistors with base structures.

Description of the Related Art

Some transistors such as bipolar transistors include a base as one of the transistor electrodes. Some types of bipolar transistors, such as heterojunction bipolar transistors (HBTs) can be used for high speed switching applications. HBTs typically implement different semiconductor material types for the emitter and base regions, creating a heterojunction. Some HBTs can handle signals of very high frequencies, up to several hundred GHz. HBTs can be used in radio-frequency (RF) systems and in applications requiring high power efficiency, such as in RF power amplifiers for cellular phones.

BRIEF DESCRIPTION OF THE DRAWINGS

The present invention may be better understood, and its numerous objects, features, and advantages made apparent to those skilled in the art by referencing the accompanying drawings.

FIGS. 27 and 29-32 are partial cutaway side views and FIG. 28 is a top view of a wafer during various stages in the manufacture of a semiconductor device according to another embodiment of the present invention.

The use of the same reference symbols in different drawings indicates identical items unless otherwise noted. The Figures are not necessarily drawn to scale.

DETAILED DESCRIPTION

The following sets forth a detailed description of at least one mode for carrying out the invention. The description is intended to be illustrative of the invention and should not be taken to be limiting.

Disclosed herein is a transistor with an emitter, base, and collector. The base includes a monocrystalline base layer. A sacrificial material is formed on the monocrystalline base layer. The sacrificial material is removed to expose a portion of the monocrystalline base layer. A base silicide includes a portion formed on the portion of the base monocrystalline base layer that was exposed by the removal of the sacrificial material.

In some embodiments, forming a transistor by forming a sacrificial material over a monocrystalline base layer and then removing the sacrificial material to expose a portion of the monocrystalline base layer for the formation of a silicide on the monocrystalline base layer may provide for a transistor with a low resistance from a base contact to the intrinsic base region in that the base silicide may be located closer to the intrinsic base region.

Some transistors such as HBTs use polycrystalline silicon (poly silicon) for an extrinsic base material. This provides for a conductivity path from the base contact through the base silicide and the extrinsic poly silicon to the intrinsic base which is located in a layer of monocrystalline (mono) semiconductor material. The polysilicon utilized for the extrinsic base material may lead to a higher resistance of this path. Accordingly providing a method where a portion of the base silicide can be formed on the base monocrystalline silicon material may reduce the resistance of the path to the base contact.

Figure 1:
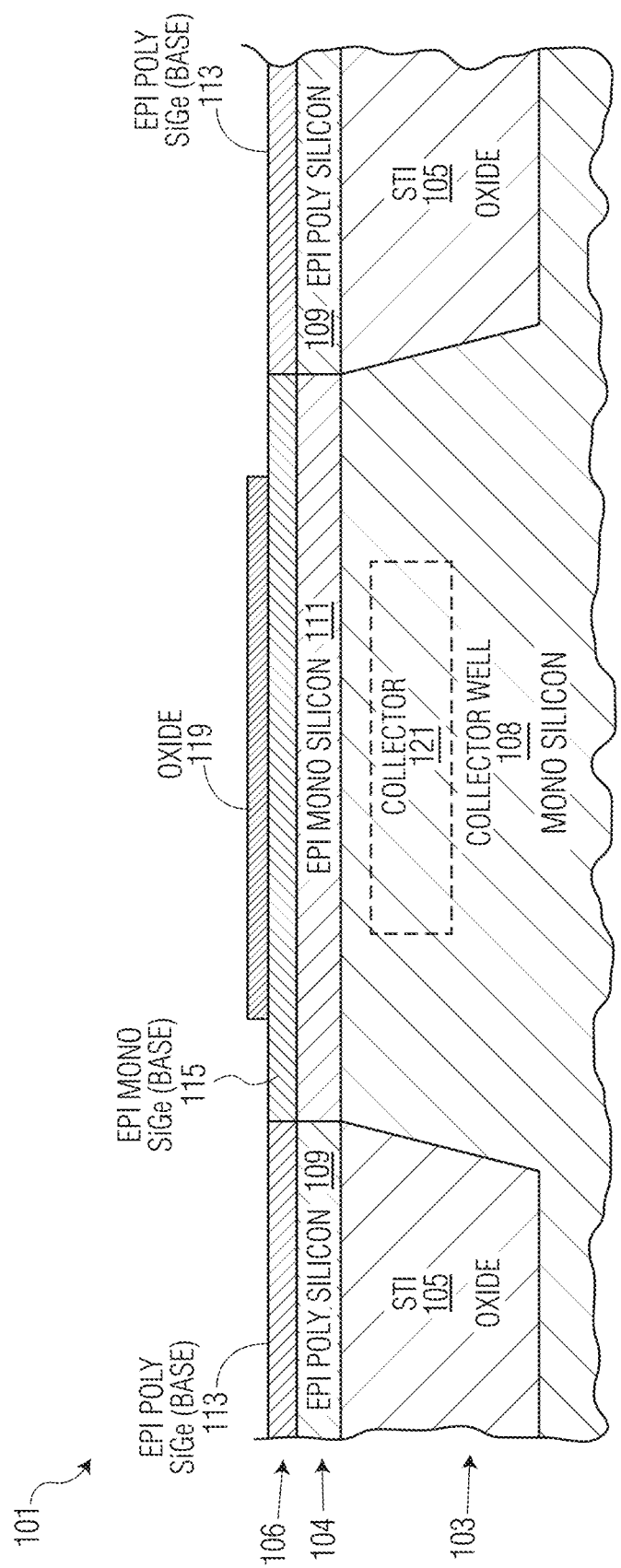
FIGS. 1-12 are partial cutaway side views of a wafer during various stages in the manufacture of a semiconductor device according to one embodiment of the present invention.

FIG. 1 is a partial cutaway side view of a wafer 101 according to one embodiment of the present invention. Wafer 101 includes a substrate layer 103 of monocrystalline silicon (Mono Silicon). A collector well 108 is laterally located between portions of a shallow trench isolation structure (STI) 105. In one embodiment, STI 105 laterally surrounds well 108. In one embodiment, well 108 is doped with N type conductivity dopants (e.g., arsenic, phosphorous) but may be doped with P type conductivity dopants (Boron) in other embodiments.

A semiconductor layer 104 is located on STI 105 and collector well 108. In one embodiment, layer 104 is made of silicon and serves as a seed layer for the formation of a subsequent semiconductor layer 106. In one embodiment, after a cleaning operation with HF acid and a pre-bake in a hydrogen atmosphere, layer 104 is formed by a non selective epitaxial growth process such that a portion 111 (EPI MONO SILICON) of layer 104 formed over mono crystalline silicon well 108 has a monocrystalline structure with an initial lattice constant generally matching that of well 108. A second portion 109 (EPI POLY SILICON) formed over the oxide of STI 105 has a polycrystalline structure.

Semiconductor layer 106 is formed over layer 104. In one embodiment, after an HF cleaning process and a hydrogen pre bake of wafer 101 are performed, layer 106 is formed by a non selective epitaxial growth process of silicon germanium. As a result of the epitaxial growth process, portion 115 of layer 106 is monocrystalline with a lattice constant initially matching that of the top portion of portion 111 of layer 104. Because portion 113 is grown on polycrystalline portion 109 of layer 104, portion 113 has a polycrystalline structure. In one embodiment, layer 106 is doped in-situ with a P type conductivity dopants (e.g., Boron), but may be doped after deposition by an ion implantation process in other embodiments. In some embodiment, a middle portion of layer 106 would be doped insitu with P-type conductivity dopants. Portion 115 will include the intrinsic base for a subsequently formed transistor. In one embodiment, layer 106 has a thickness in the range of 15-30 nm but may have other thicknesses in other embodiments.

An oxide pad 119 is formed on selected portions of layer 106. In one embodiment, pad 119 is formed by a low pressure chemical vaper deposition (LPCVD) process or a plasma enhanced chemical vapor deposition (PECVD) blanket deposition process where the formed layer has a thickness in a range 5-20 nm, but may have other thicknesses or be formed by other processes in other embodiments. After the formation of the oxide layer, a photoresist layer (not shown) is formed and patterned to form a mask to pattern the oxide layer to form pad 119. Afterwards, the photoresist mask is removed.

FIG. 1 also shows wafer 101 after a selectively implanted collector (SIC) region 121 is formed by an ion implantation of N-type dopants prior to the formation of SiGe layer 106. In one embodiment, region 121 is formed by the ion implantation of N-type conductivity dopants at a dosage of 2e13~2e14 per $cm^3$ and at energies in the range of 100~500 keV, but may be formed with other dosages and at other energies in other embodiments. Region 121 serves as a collector region for a subsequently formed transistor. In other embodiments, collector region 121 may be formed during other subsequent stages of manufacture.

In other embodiments, wafer 101 may have other configurations, include other layers, be made of other materials, and/or be formed by other methods.

Figure 2:
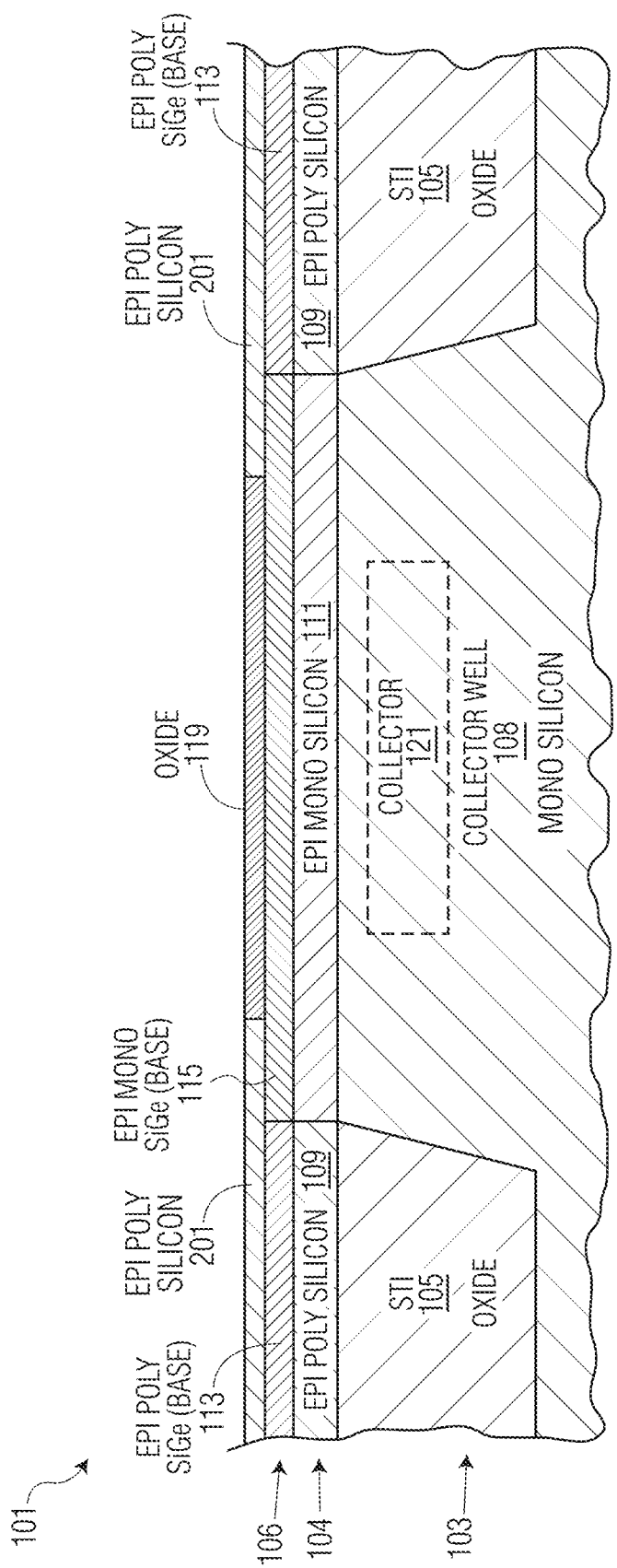

FIG. 2 is a partial cutaway side view of a wafer 101 after a layer of poly silicon 201 is selectively grown on portion 113. Layer 201 has a similar thickness as pad 119. In other embodiments, a blanket layer of poly silicon (not shown) may be deposited on wafer 101 where wafer 101 is planarized using pad 119 as an etch stop.

Figure 3:
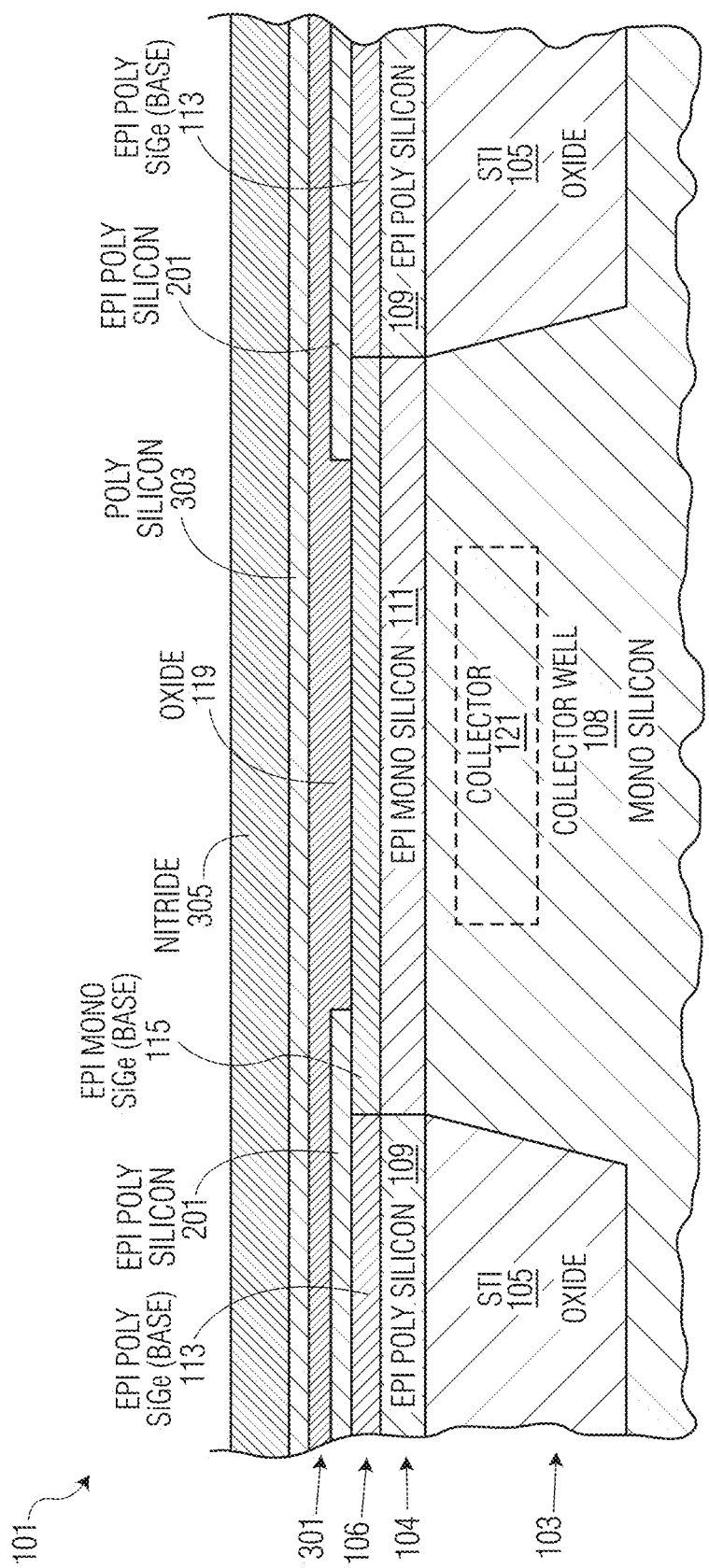

FIG. 3 is a partial cutaway side view of a wafer 101 after a layer of oxide 301 is deposited on layer 201 and pad 119. In one embodiment, layer 301 has a thickness of 20 nm, but may be of other thicknesses in other embodiments. Afterwards, a layer of poly silicon 303 is formed on layer 301, followed by a layer of Nitride layer 305.

Figure 4:
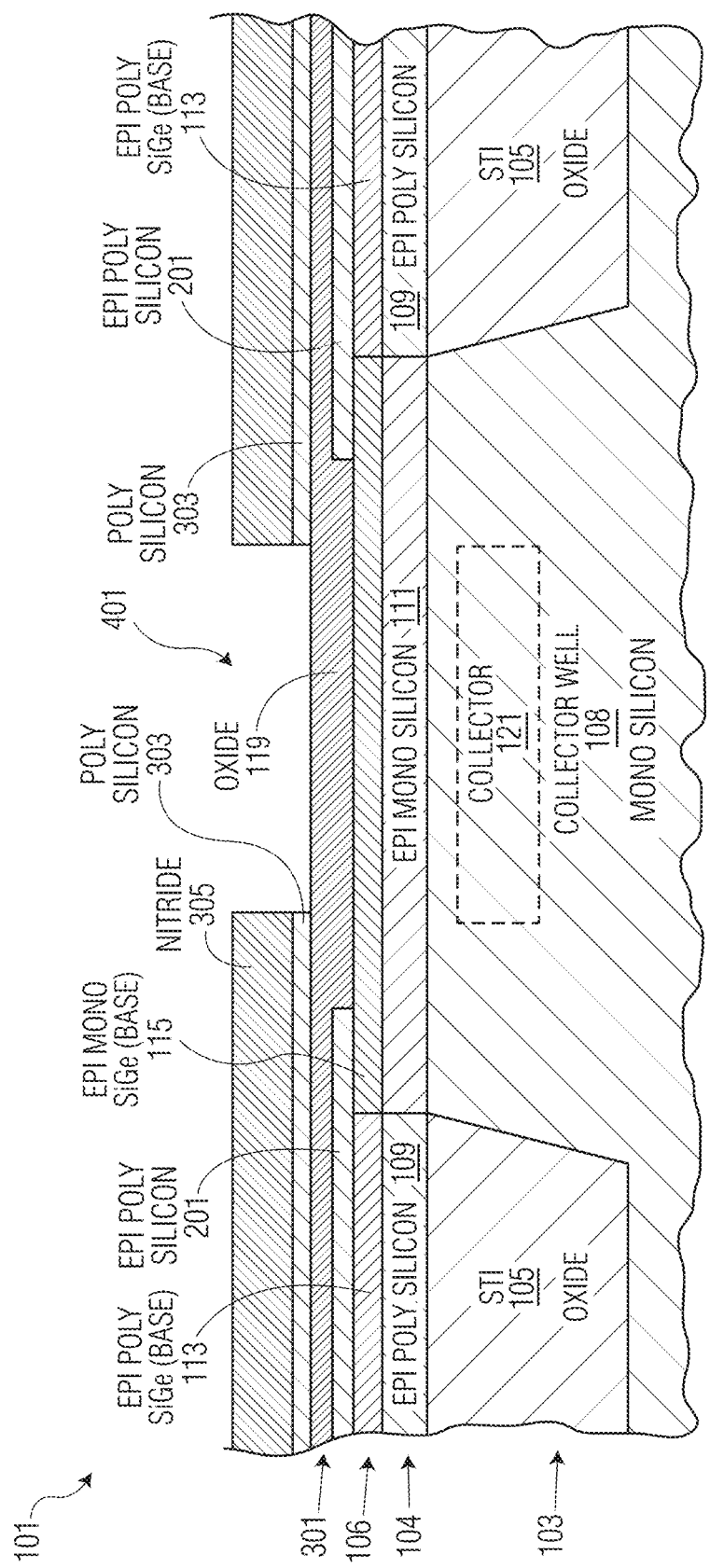

FIG. 4 is a partial cutaway side view of wafer 101 after an emitter widow opening 401 is formed in layers 305 and 303 to expose oxide layer 301. In one embodiment, opening 401 is formed by a timed reactive ion etch (RIE) through an opening in a patterned photoresist mask (not shown). However, opening 401 may be formed by other ways in other embodiments. In the embodiment shown, opening 401 is formed in an area of wafer 101 that is located between STI 105 portions shown in FIG. 4.

Figure 5:
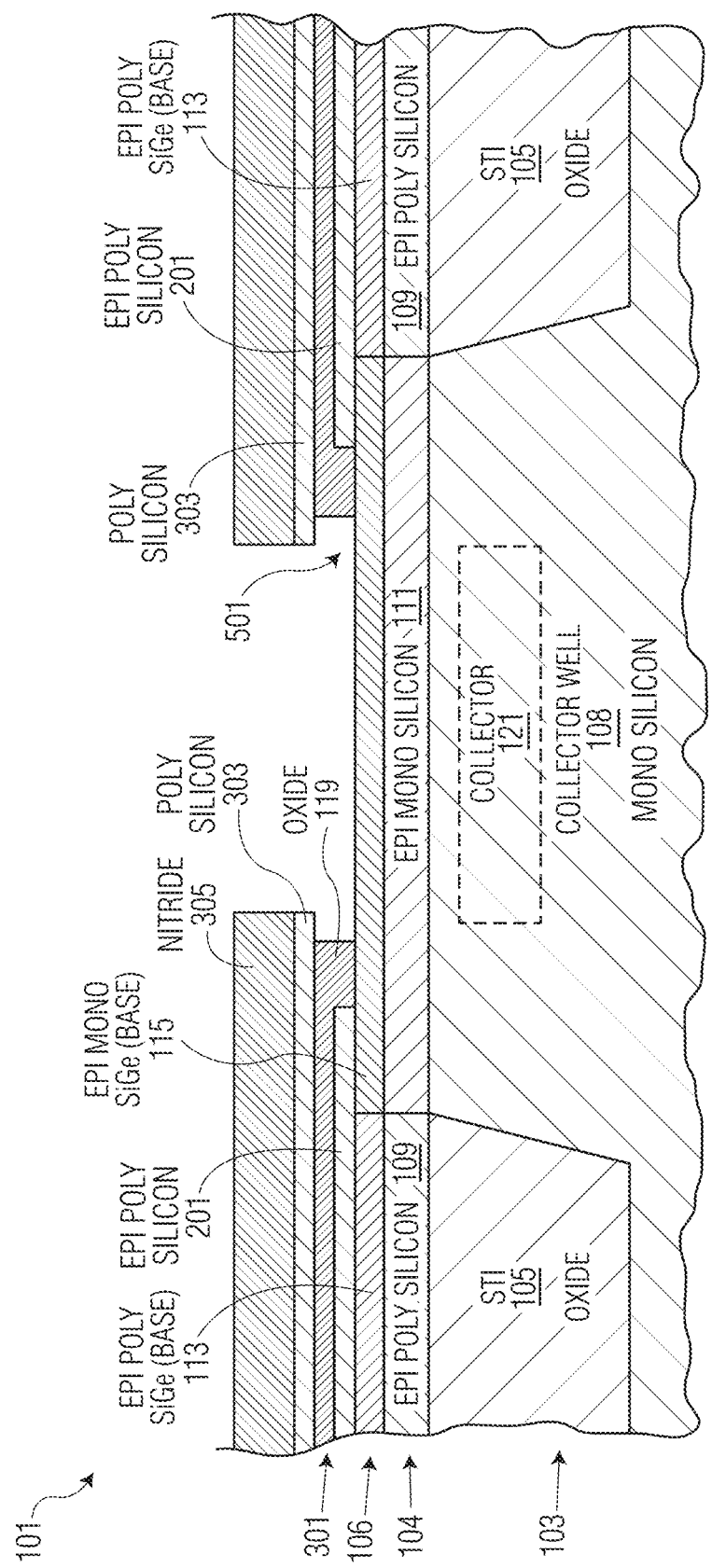

FIG. 5 is a partial cutaway side view of wafer 101 after the pattern photo resist mask (not shown) is removed and layer 301 and pad 119 are isotropically (wet) etched to expose SiGe portion 115 and to etch back layer 301 and pad 119 past the edge of patterned nitride layer 305 and poly silicon layer 303 at location 501. In one embodiment, layer 301 and pad 119 would be first anisotropically etched to expose portion 115 followed by an isotropic timed etch to remove the portions of layer 301 and pad 119 at location 501.

Figure 6:
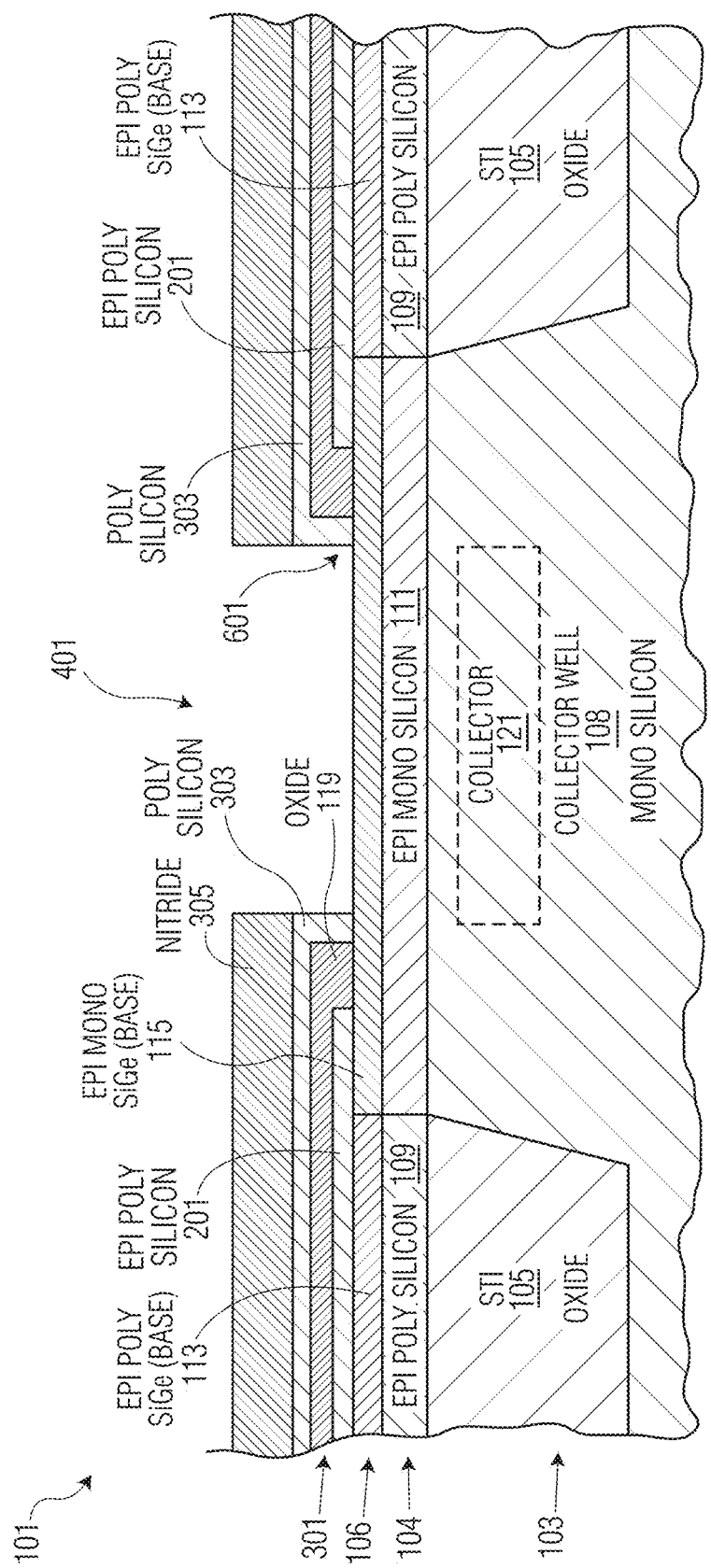

FIG. 6 is a partial cutaway side view of wafer 101 after the etched back sidewalls of pad 119 and oxide layer 301 are sealed with silicon 601. In one embodiment, silicon 601 is formed by subjecting wafer 101 to a low temperature anneal in a hydrogen ambient, facilitating silicon atom mobility from layer 303 and SiGe portion 115 to seal exposed portions of pad 119 and layer 301.

Figure 7:
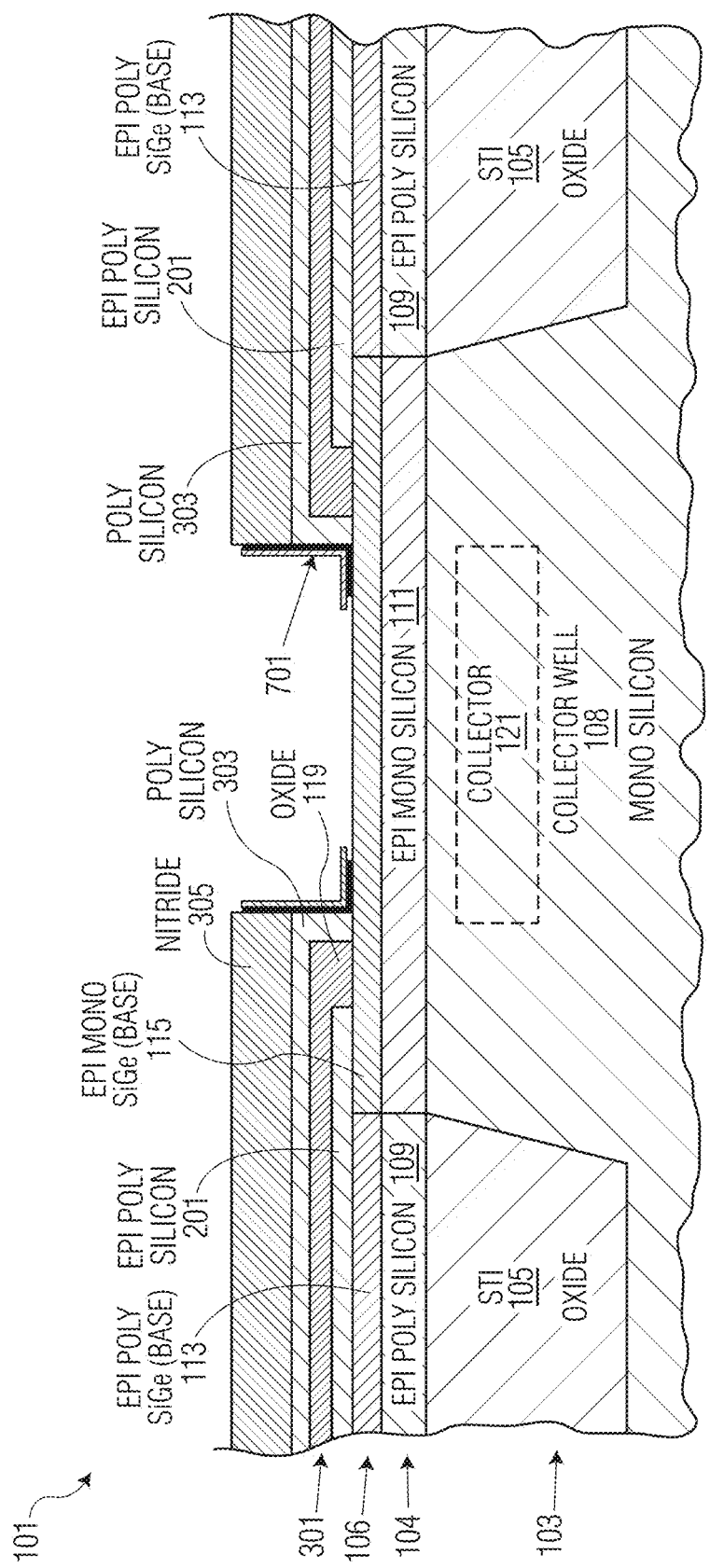

FIG. 7 is a partial cutaway side view of wafer 101 after the formation of an emitter window spacer 701. In one embodiment, spacer 701 is formed on the inside walls of the emitter window opening 401. In the cross-sectional view of FIG. 7, spacer 701 is shown as two separate portions. However, for the embodiment of FIG. 7, spacer 701 is contiguous around the entire perimeter of emitter window opening 401. The bottom of spacer 701 further narrows the emitter window to narrow the contact area between the intrinsic base portion 115 and a subsequently formed monocrystalline emitter portion 803 in FIG. 8.

In the embodiment shown, spacer 701 includes a thin layer of nitride located over a thin layer of oxide. In one embodiment, spacer 701 is formed by forming an initial thin oxide layer, followed by forming a thin nitride layer, and then followed by forming a subsequent oxide layer (not shown). Afterwards, a poly silicon spacer (not shown) is formed to define the width of the bottom opening in spacer 701 were the oxide-nitride-oxide layers are etched using the poly silicon spacer as a mask. The subsequent oxide layer is anisotropically etch to form an oxide spacer (not shown) that is then used to anisotropically etch the thin nitride layer, which is then used to etch (isotropically, anisotropically, or by a combination) the initial thin oxide layer, where the initial oxide layer and the nitride layer make up spacer 701. The oxide spacer of the subsequent oxide layer is removed during subsequent processing (e.g., during an HF acid clean before the emitter material deposition), although it may remain in some embodiments. In other embodiments, a spacer 701 may be formed by other ways. Some embodiments may not include spacer 701.

Figure 8:
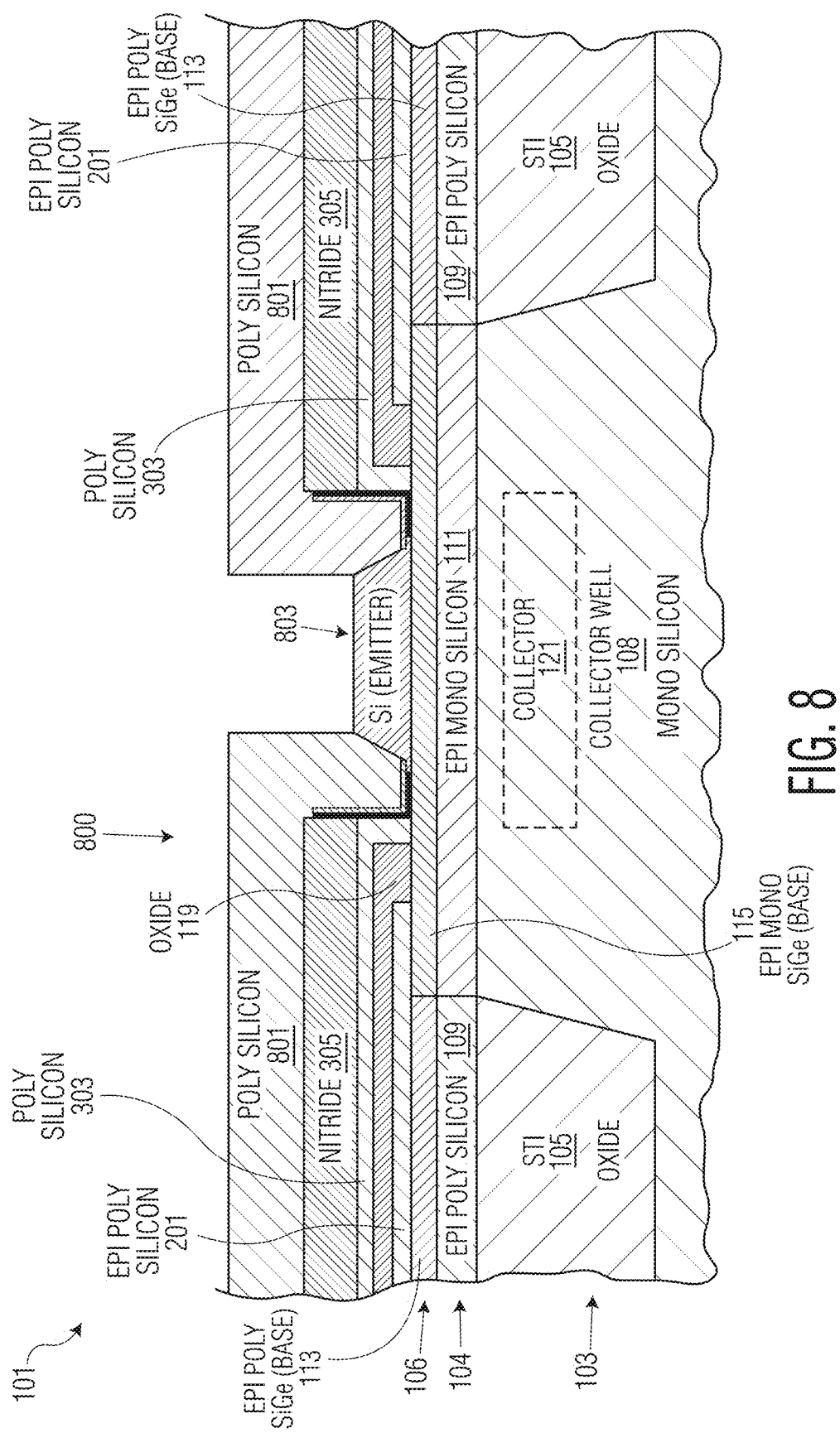

FIG. 8 is a partial cutaway side view of wafer 101 after the formation of a silicon electrode layer 800. In one embodiment, layer 800 is grown by an epitaxial process where portion 801 is poly silicon and portion 803 (which is located over the opening in spacer 701) is monocrystalline. Portion 803 will serve as the intrinsic electrode for the transistor.

Figure 9:
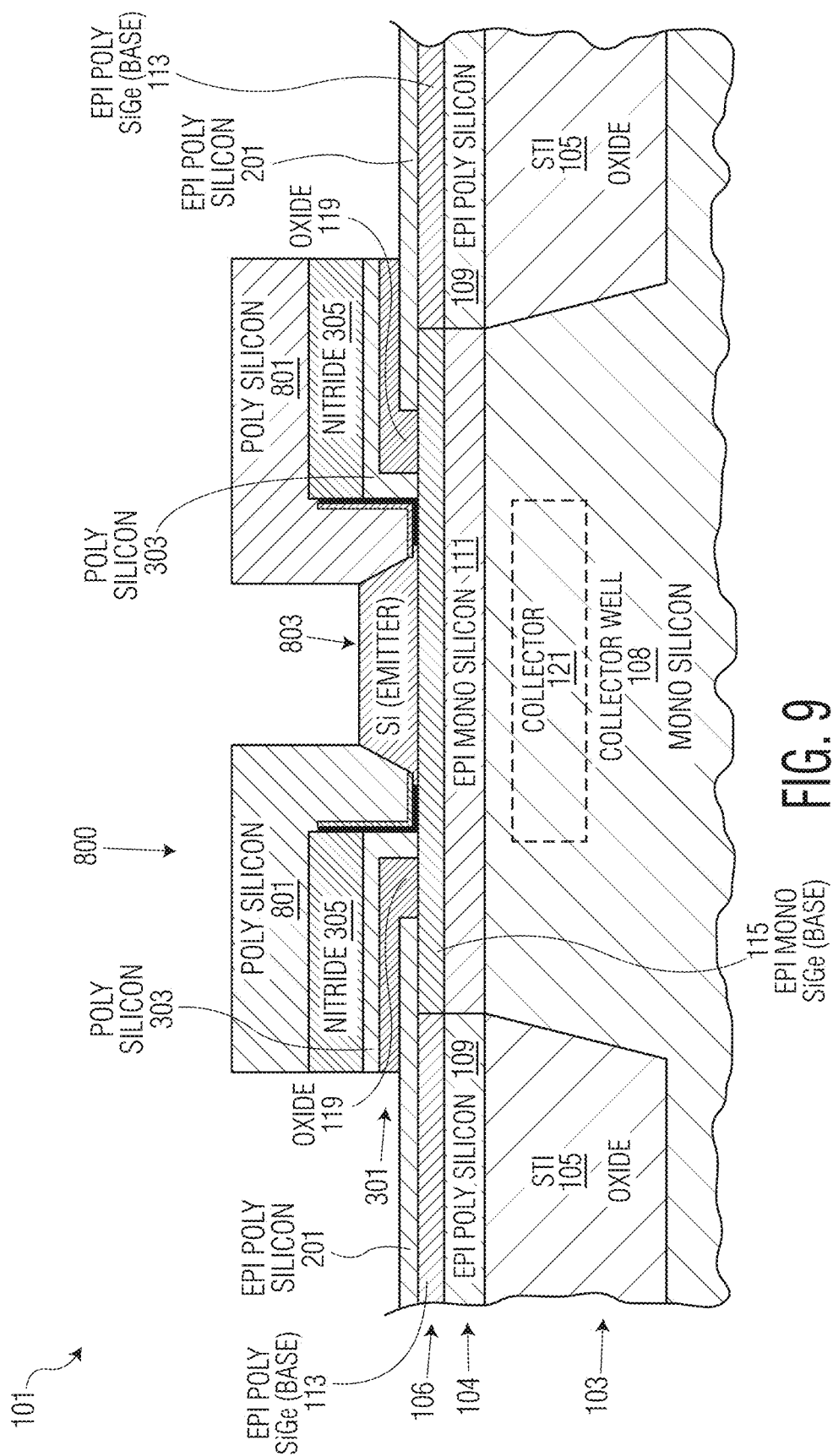

FIG. 9 is a partial cutaway side view of wafer 101 after polysilicon portion 801, nitride layer 305, polysilicon layer 303 and oxide layer 301 are patterned to expose polysilicon layer 201. In one embodiment, these layers are patterned through a patterned photoresist mask (not shown) using a reactive ion etch (RIE).

Figure 10:
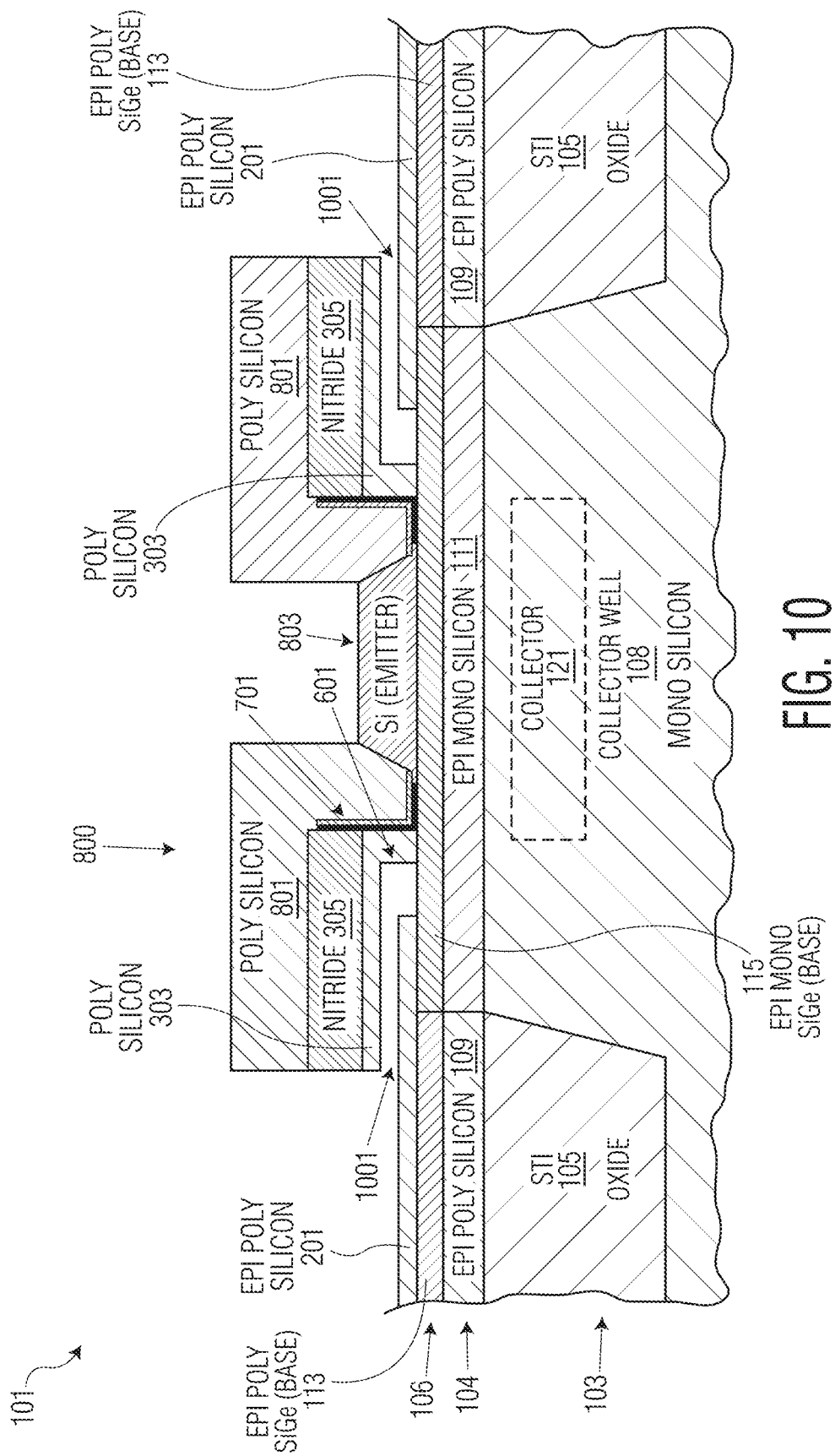

FIG. 10 is a partial cutaway side view of wafer 101 after oxide layer 301 and pad 119 have been etched with an isotropic etch. The removal of oxide layer 301 and pad 119 exposes portions of poly silicon layer 201, poly silicon layer 201, silicon 601, and monocrystalline base portion 115. Silicon 601 prevents the oxide of spacer 701 from being etched during the removal of the oxide.

Figure 11:
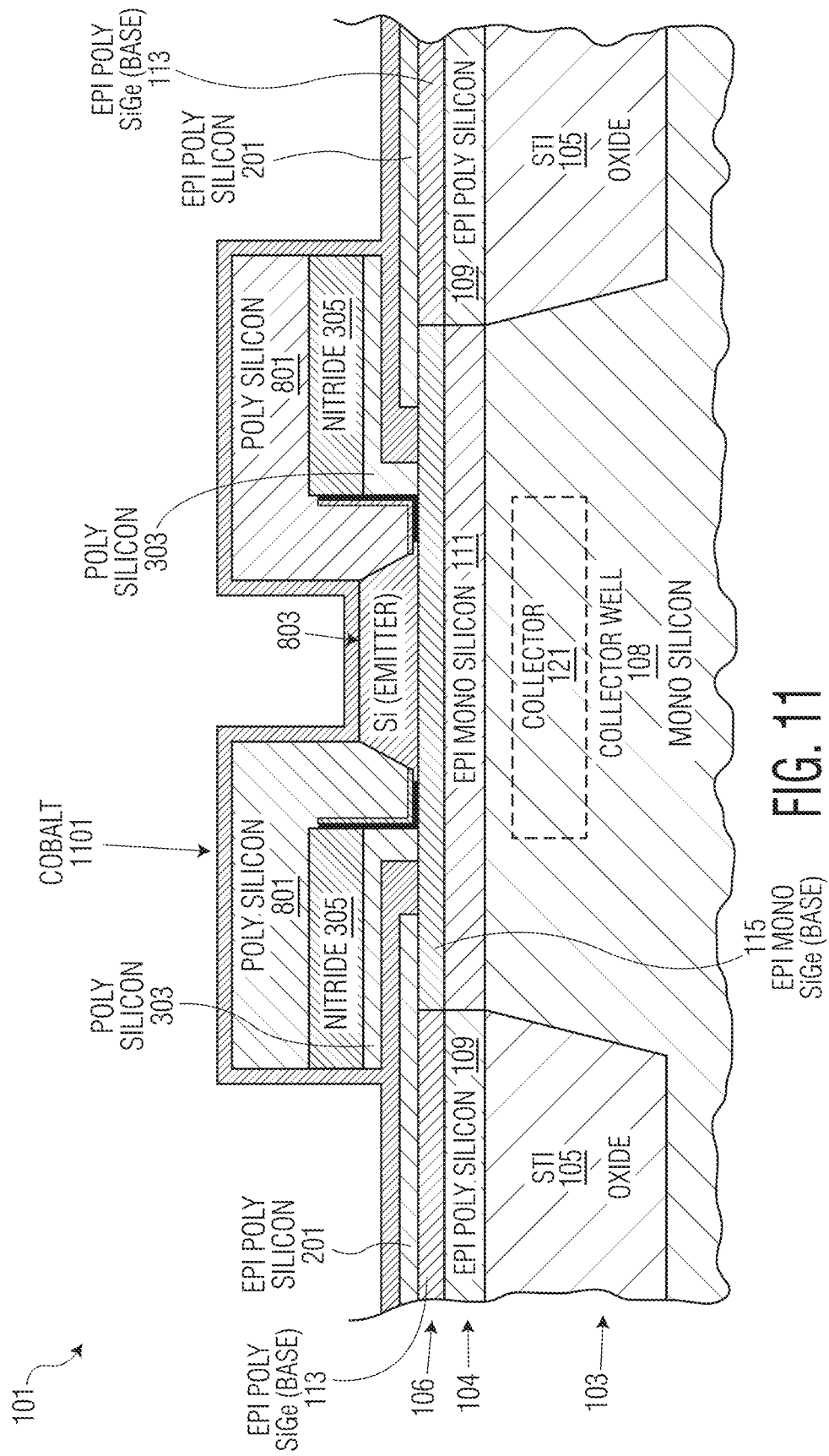

FIG. 11 is a partial cutaway side view of wafer 101 after a layer of cobalt 1101 has been deposited on the exposed surfaces of wafer 101. As shown in FIG. 11, the cobalt is deposited on the surfaces that were exposed by the removal of oxide layer 301 and pad 119 (as shown in the view of FIG. 10). In one embodiment, the cobalt is deposited using a chemical vapor deposition (CVD) process. However, in other embodiment, other metals used for silicidation (e.g., tungsten, platinum, nickel) may be deposited.

Figure 12:
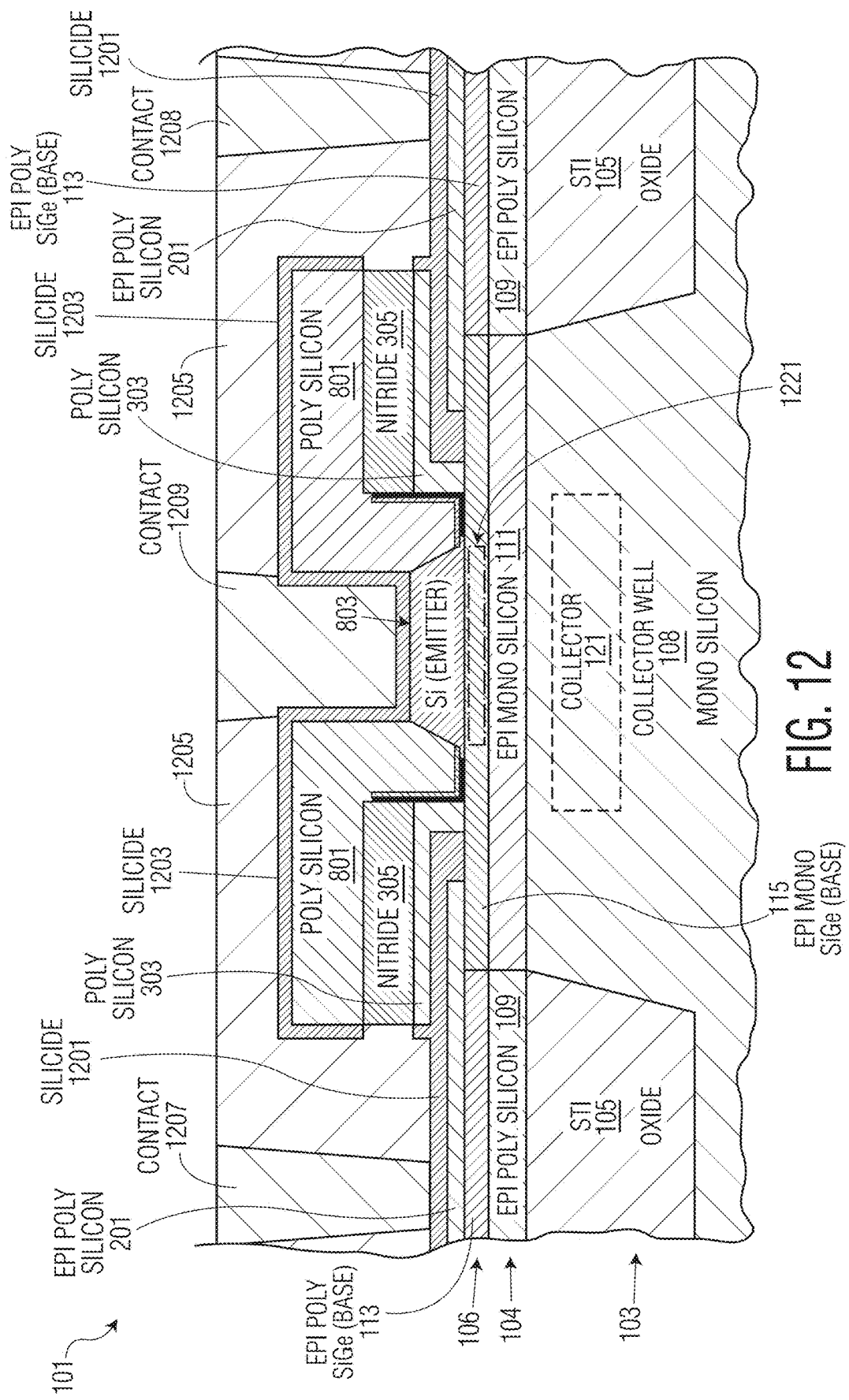

FIG. 12 is a partial cutaway side view of wafer 101 after wafer 101 has been annealed at a high temperature where the deposited cobalt 1101 as shown in FIG. 11 is reacted with any exposed semiconductor material that includes silicon to form a layer of cobalt silicide on those surfaces. The unreacted cobalt is then removed. In FIG. 12, a base silicide 1201 is formed on poly silicon layer 201, poly silicon layer 303, silicon 601, and on monocrystalline SiGe base portion 115. An emitter silicide 1203 is formed on portion poly silicon portion 801 and mono silicon portion 803 of the emitter electrode.

FIG. 12 also shows wafer 101 after one of more layers of dielectric material 1205 are formed on wafer 101. Openings are then formed in material 1205 to expose the silicide structures (e.g., silicides 1201 and 1203). Contact metal (e.g., tungsten, titanium, and/or titanium nitride) is then formed in the openings where wafer 101 is planarized to form the contacts for the electrodes of wafer 101. For example, base contacts 1207 and 1208 (contact on right side of wafer 101) are formed to contact base silicide 1201 and emitter contact 1209 is formed to contact emitter silicide 1203.

Accordingly, FIG. 12 shows a cross section of a HBT bipolar transistor with an emitter that includes an intrinsic emitter of N type doped portion 803 and emitter portion 801. The bipolar transistor includes a base including a P-type doped intrinsic base 1221 in mono SiGe base layer portion 115, poly SiGe portion 113, poly silicon layer 201, and poly silicon layer 303. The transistor also includes a collector including region 121 located in collector well 108.

As shown in FIG. 12, base contacts 1207 and 1208 electrically contact base silicide 1201. Base silicide 1201 provides an electrical path from the base contacts to monocrystalline SiGe layer portion 115 (which includes a boron doping) which includes the intrinsic base 1221 that is directly between intrinsic emitter portion 803 and collector region 121. Accordingly, providing a process where a sacrificial material (e.g., the oxide of pad 119) that is formed in contact with the mono base portion (115) and removed to form a silicide, may provide the transistor of FIG. 12 with a silicided path to lower the base biasing resistance from contacts 1207 and 1208 to intrinsic base 1221. The contact for the collector is not shown in the cutaway view of FIG. 12.

After the stage of manufacture shown in FIG. 12, subsequent processes may be performed on wafer 101. For example, upper interconnect layers (not shown) may be formed on top of wafer 101 and include conductive structures electrically coupled to the contacts for the collector, emitter, and/or base of the transistor of FIG. 12 as well as to the contacts of other devices formed on wafer 101. Afterwards, wafer 101 is separated into multiple semiconductor dies each with at least one transistor similar to the transistor shown in FIG. 12. The die are protected in semiconductor packages that can be implemented in electronic systems such as e.g., RF communications devices, motor controllers, automotive electronics systems, or cellular phones. In one example, the transistor is used as a power amplifier to amplify a received RF signal or to amplify an RF signal to be transmitted, for example, as used in a cellular telephone.

Figure 13:
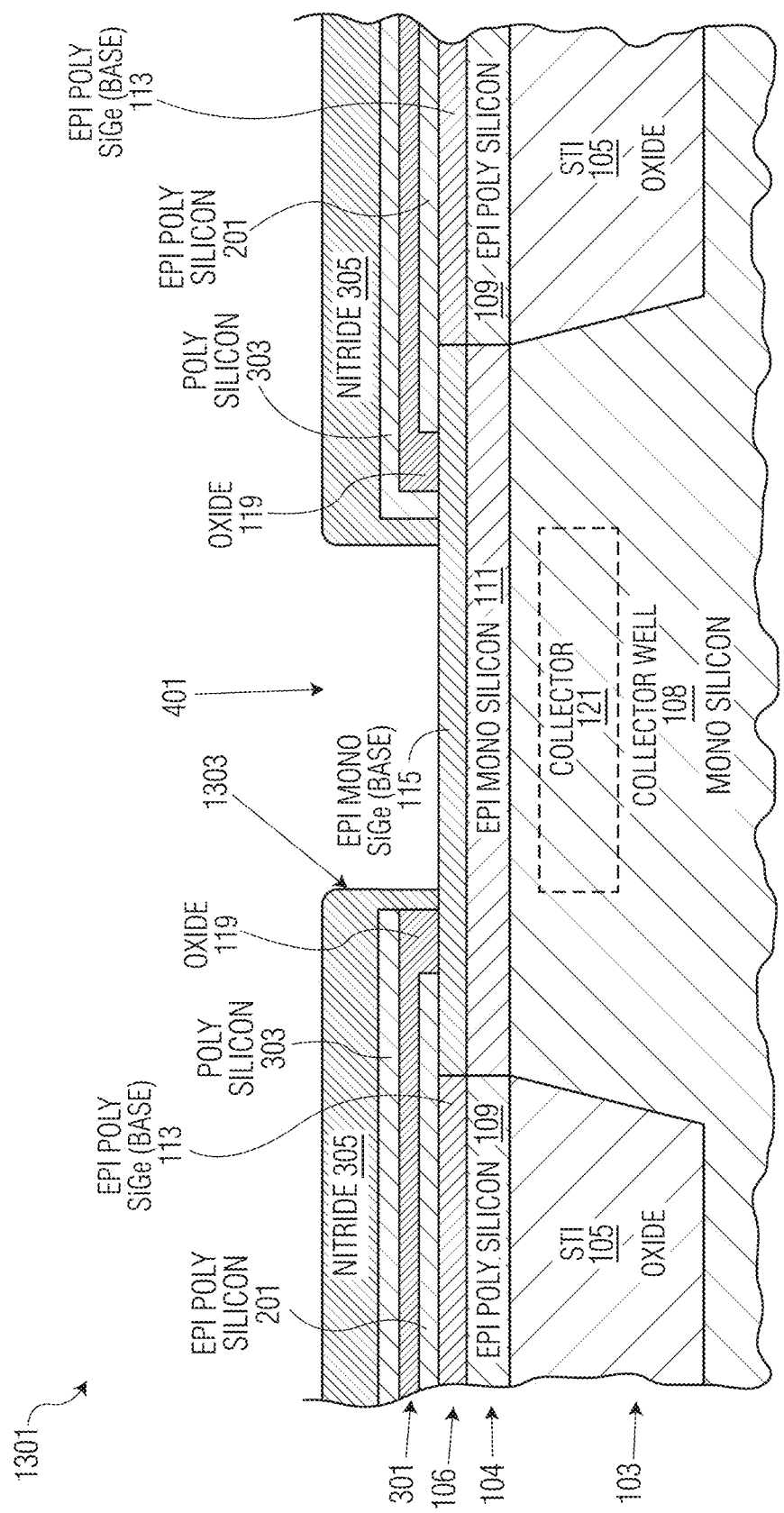
FIG. 13 is a partial cutaway side view of a wafer at a stage in the manufacture of a semiconductor device according to another embodiment of the present invention.

FIG. 13 is a cutaway side view of a wafer 1301 during a stage in the manufacturer of a transistor according to another embodiment. The stage shown in FIG. 13 shows an alternative embodiment to some of the processes of FIGS. 1-12, where structures having the same reference numbers are similar. FIG. 13 is a subsequent stage to the stage of FIG. 4 and shows an alternative process for sealing the oxide material from the emitter window opening 401. In the embodiment of FIG. 13, after the stage of FIG. 4, oxide layer 301 and pad 119 are anisotropically etched through emitter window 401 to expose layer portion 115. Afterwards, a nitride spacer 1303 is formed on the side wall of opening 401 by the deposition of a thin nitride layer and a timed anisotropic etch of the nitride layer to expose layer portion 115. Nitride spacer 1303 seals oxide layer 301 and pad 119. Afterwards, the processes shown and described subsequent to FIG. 6 (with respect to the embodiment of FIGS. 1-12) are performed on wafer 101.

Some embodiments using a nitride spacer 1303 for sealing the sacrificial oxide do not include polysilicon layer 303, wherein the nitride layer 305 would be formed on oxide layer 301. Also in some embodiments, oxide layer 301 and pad 119 may be isotropically etched to be set back the edges of those structures from the sidewall of opening 401.

FIGS. 14-23 are partial cutaway side views of a wafer during various stages in the manufacture of a transistor according to another embodiment of the present invention. Structures with the same references numbers as with earlier described embodiments are similar.

Figure 14:
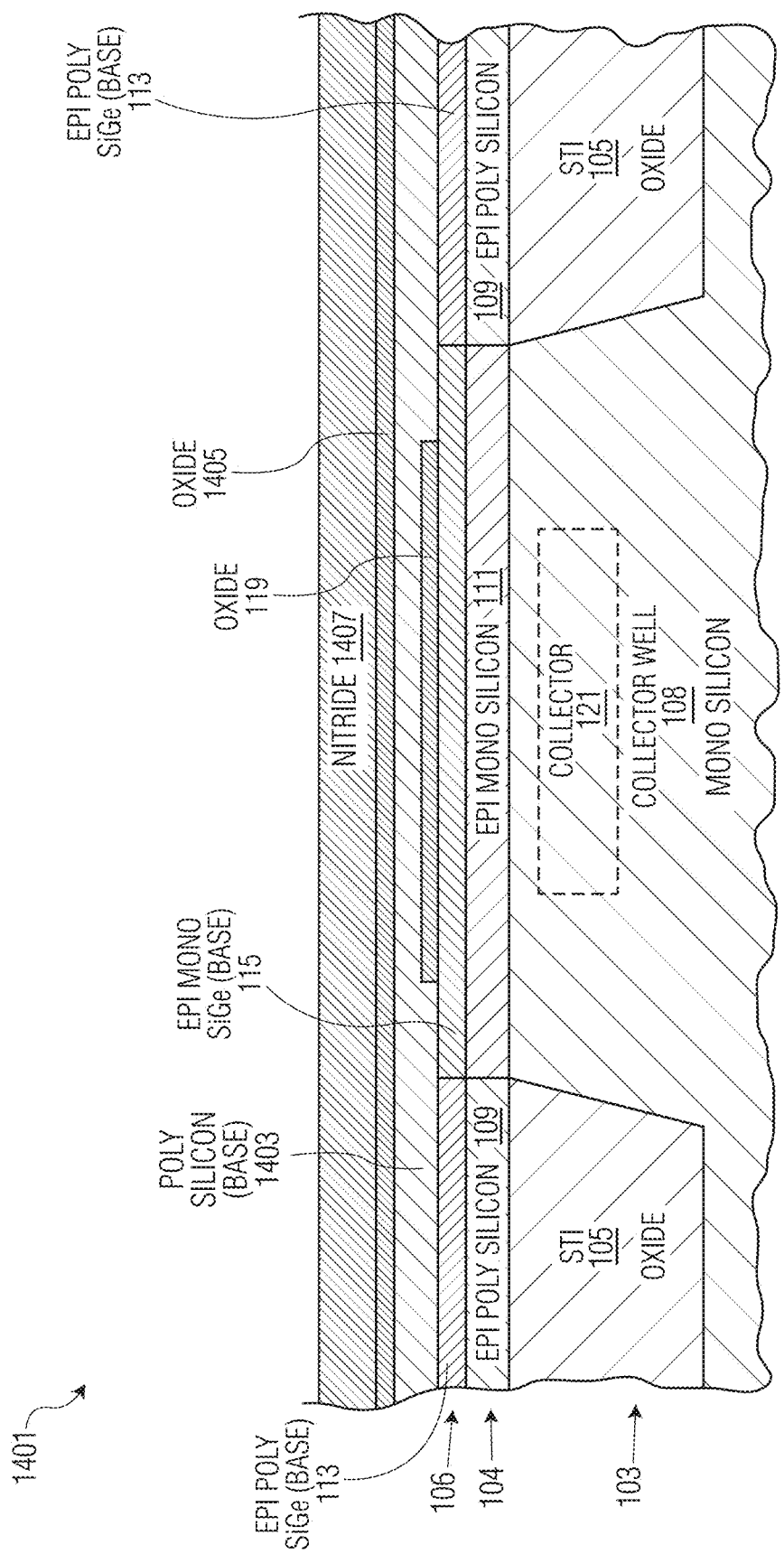
FIGS. 14-23 are partial cutaway side views of a wafer during various stages in the manufacture of a semiconductor device according to another embodiment of the present invention.

FIG. 14 is a partial cutaway side view of wafer 1401 at a stage in the manufacture of a transistor. FIG. 14 is subsequent to the stage shown in FIG. 1. After the stage of FIG. 1, a poly silicon base layer 1403 is formed on wafer 1401 over layer 106 and oxide pad 119. An oxide layer 1405 is formed on layer 1403 and a nitride layer 1407 is formed on oxide layer 1405.

Figure 15:
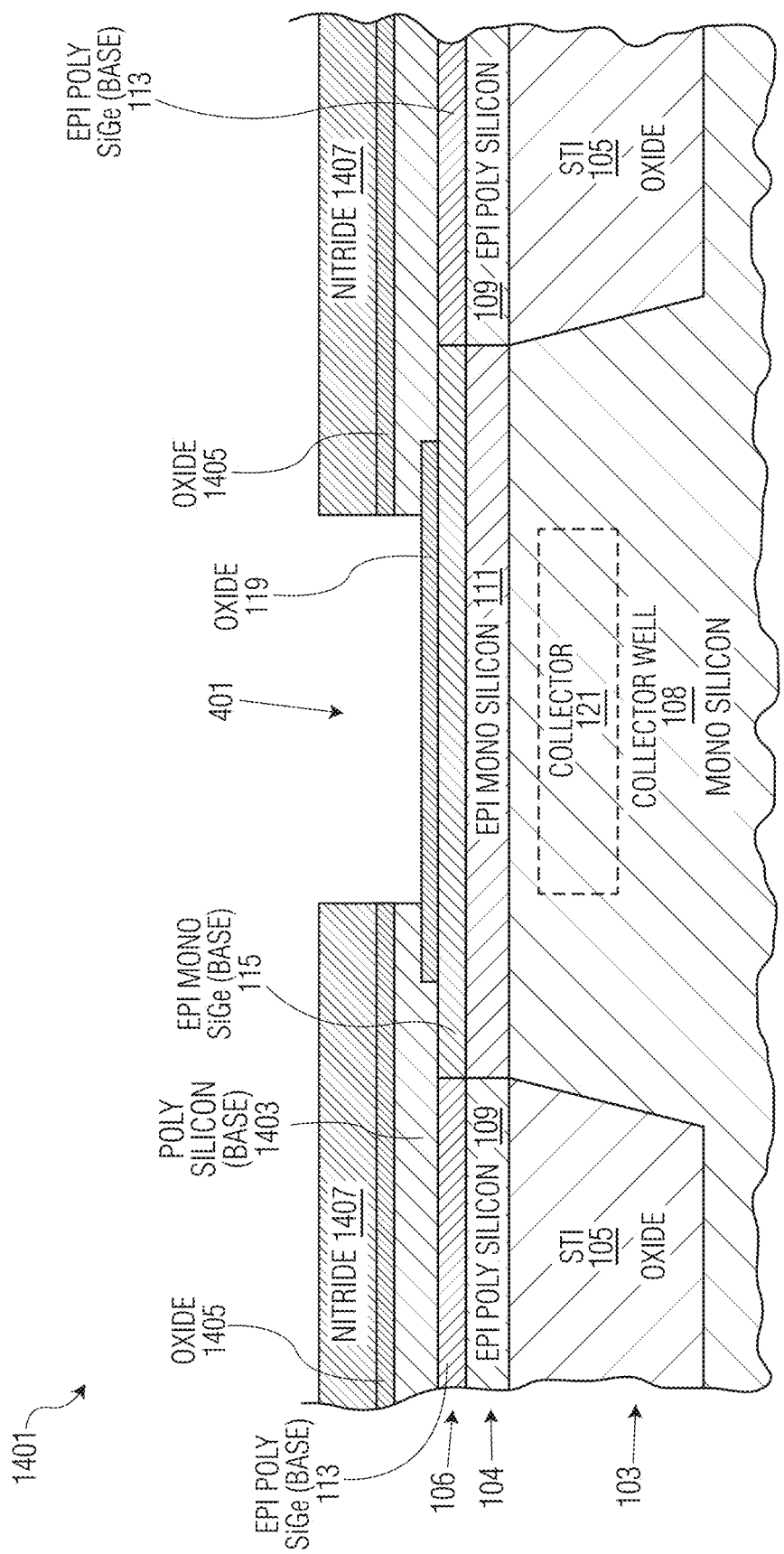

FIG. 15 is a partial cutaway side view of wafer 1401 after an emitter window opening 401 is formed in wafer 1401 to expose oxide pad 119.

Figure 16:
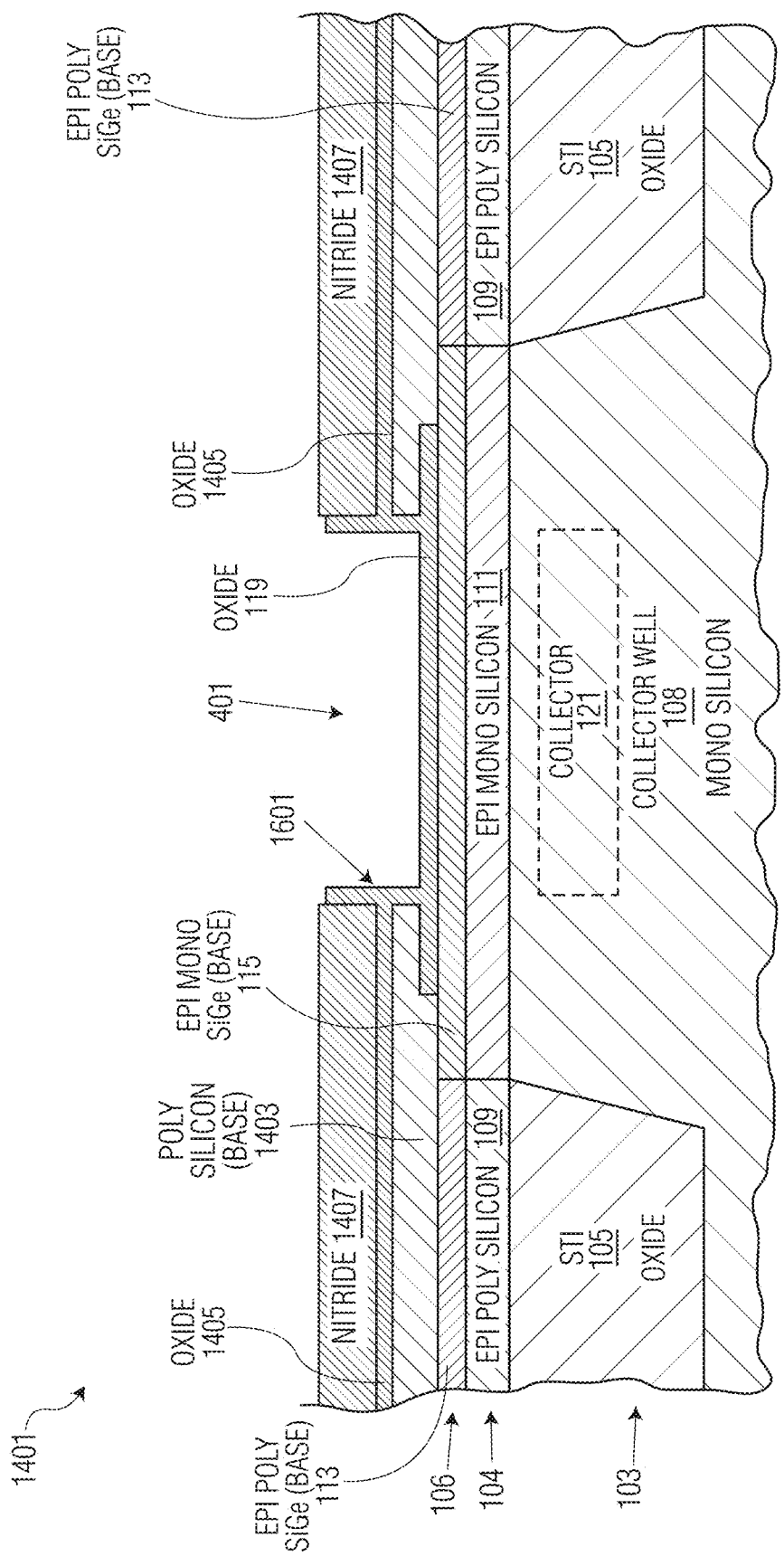

FIG. 16 is a partial cutaway side view of wafer 1401 after an oxide sidewall spacer 1601 is formed on the side wall of emitter window 401. In one embodiment, spacer 1601 is formed by the deposition of an oxide layer on wafer 1401 and an anisotropic etching of the oxide layer. In one embodiment, the width of spacer 1601 is the same as the thickness of oxide layer 1405. In one embodiment, spacer 1601 has a width of 10 nm, but may be of other widths in other embodiments.

Figure 17:
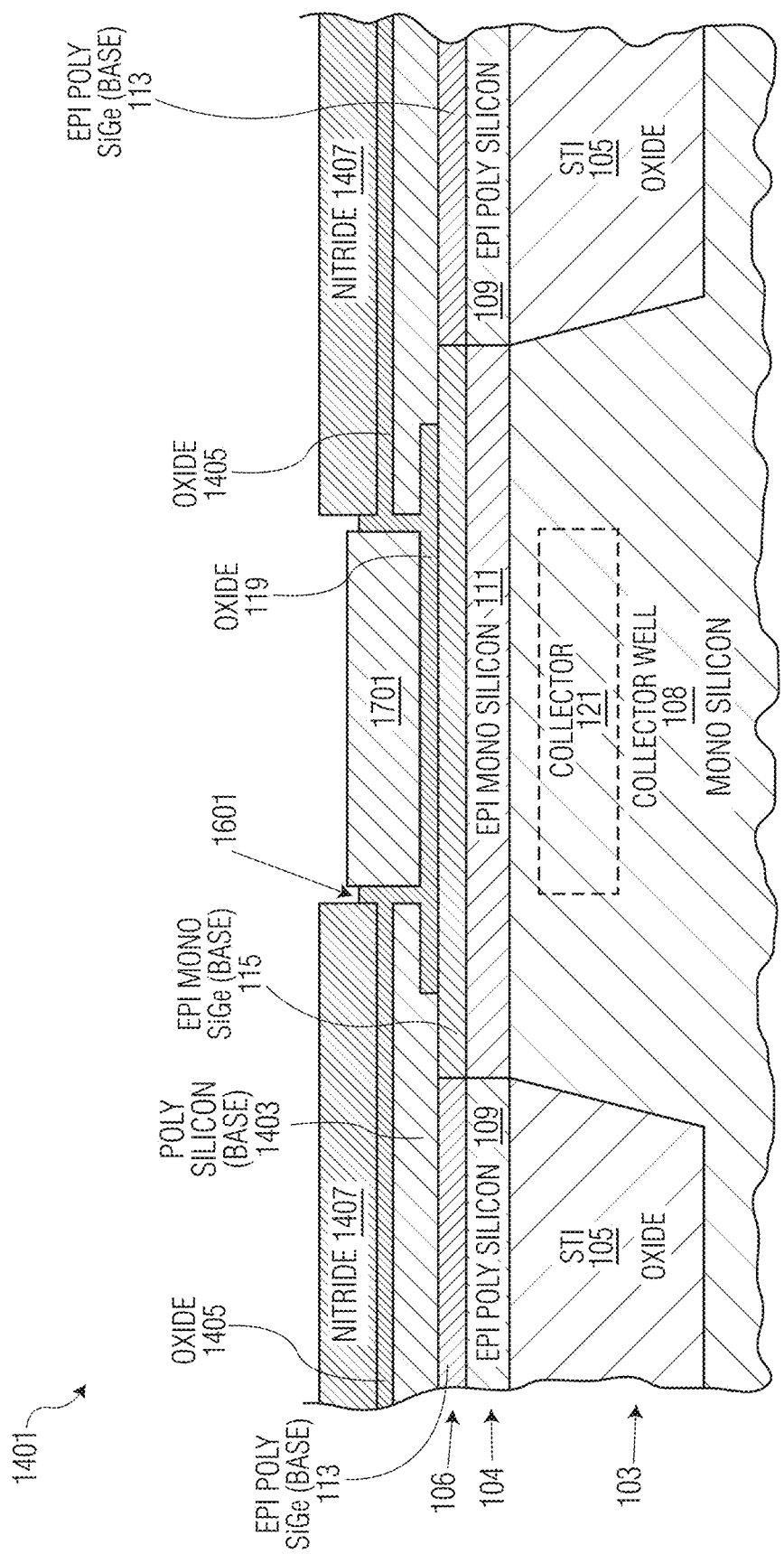

FIG. 17 is a partial cutaway side view of wafer 1401 after a sacrificial plug is 1701 is formed in emitter opening 401 and spacer 1601 is etched to reduce the height of the spacer. In one embodiment, plug 1701 is formed by the deposition of poly silicon followed by a timed etch to reduce the top of plug 1701 below the height of nitride layer 1407. In another embodiment, a chemical mechanical polish process may be used in conjunction with a timed etch to recess the top of plug 1701. Afterwards, wafer 1401 is subjected to an anisotropic etch to remove a top portion of spacer 1601.

Figure 18:
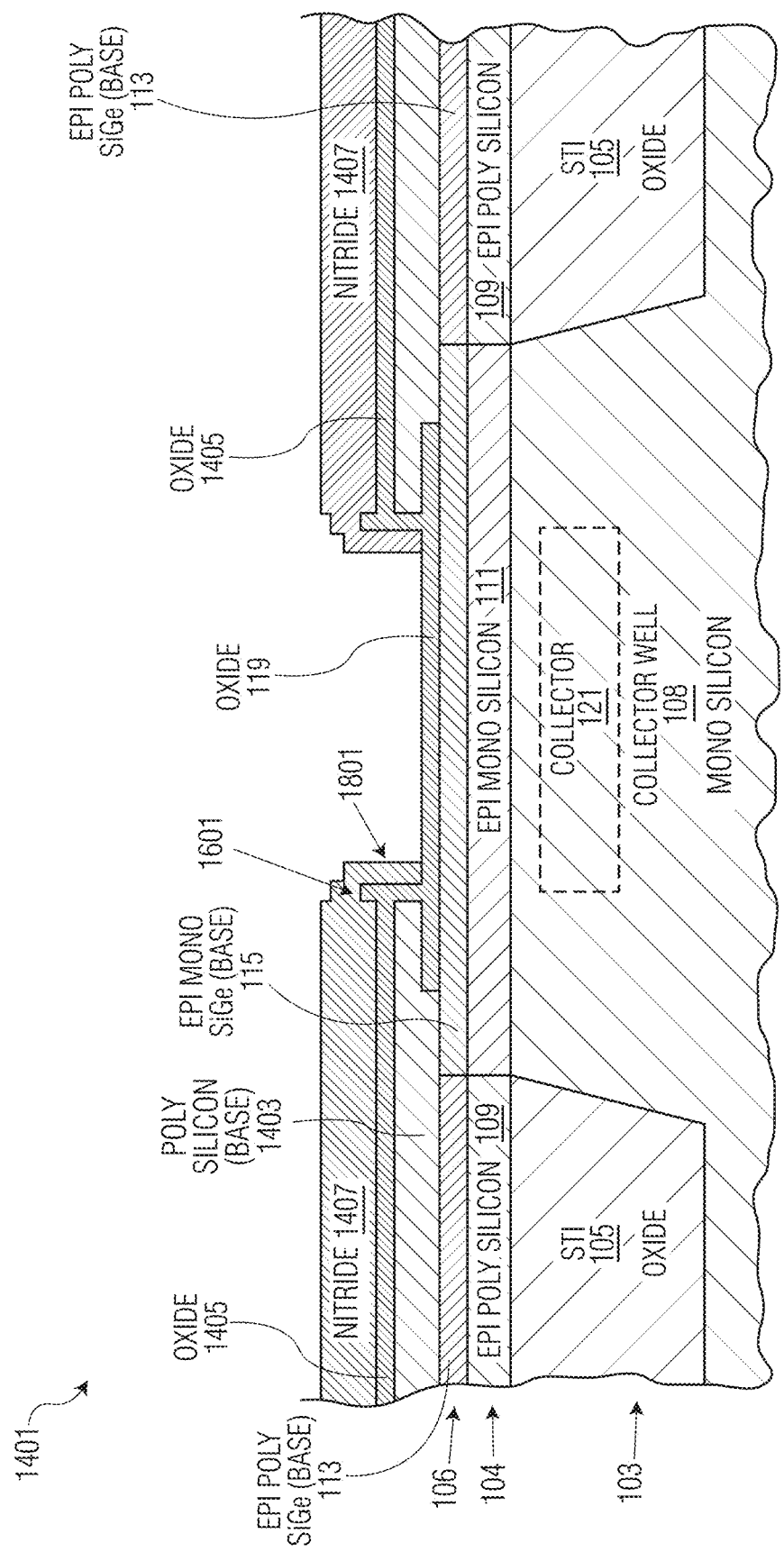

FIG. 18 is a partial cutaway side view of wafer 1401 after a nitride sidewall spacer 1801 is formed on the sidewall of emitter window 401 after the removal of plug 1701. In one embodiment, spacer 1801 is formed by depositing a layer of nitride (not shown) followed by an anisotropic etch of the nitride layer to expose pad 119. In one embodiment, spacer 1801 has a width of 15 nm, but may be of other widths in other embodiments.

Figure 19:
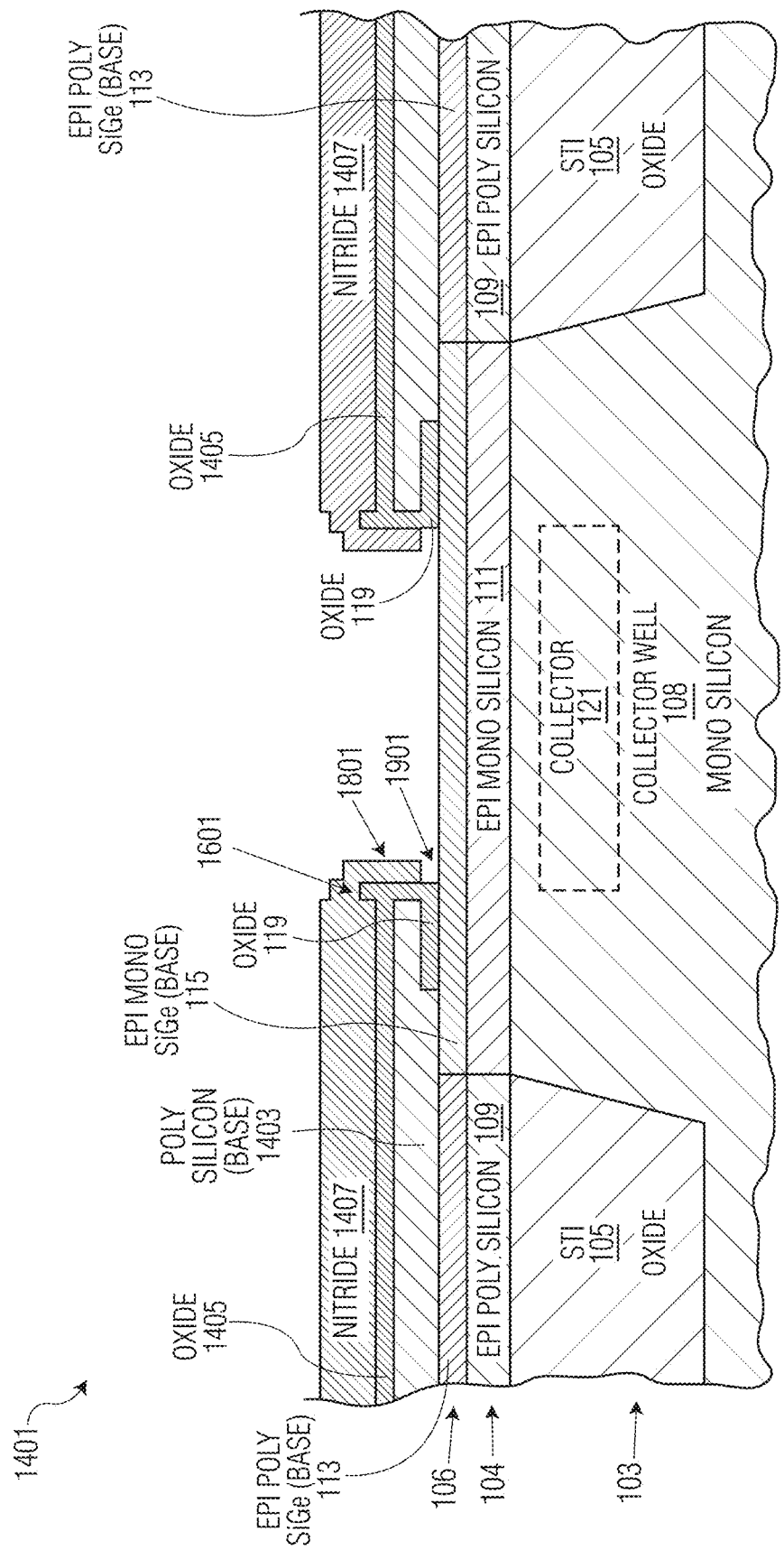

FIG. 19 is a partial cutaway side view of wafer 1401 after wafer 1401 has been subjected to a timed wet etch to remove a portion of pad 119. As shown in FIG. 19, a portion of pad 119 located directly beneath spacer 1801 at location 1901 is removed to set back pad from the exposed sidewall of spacer 1801.

Figure 20:
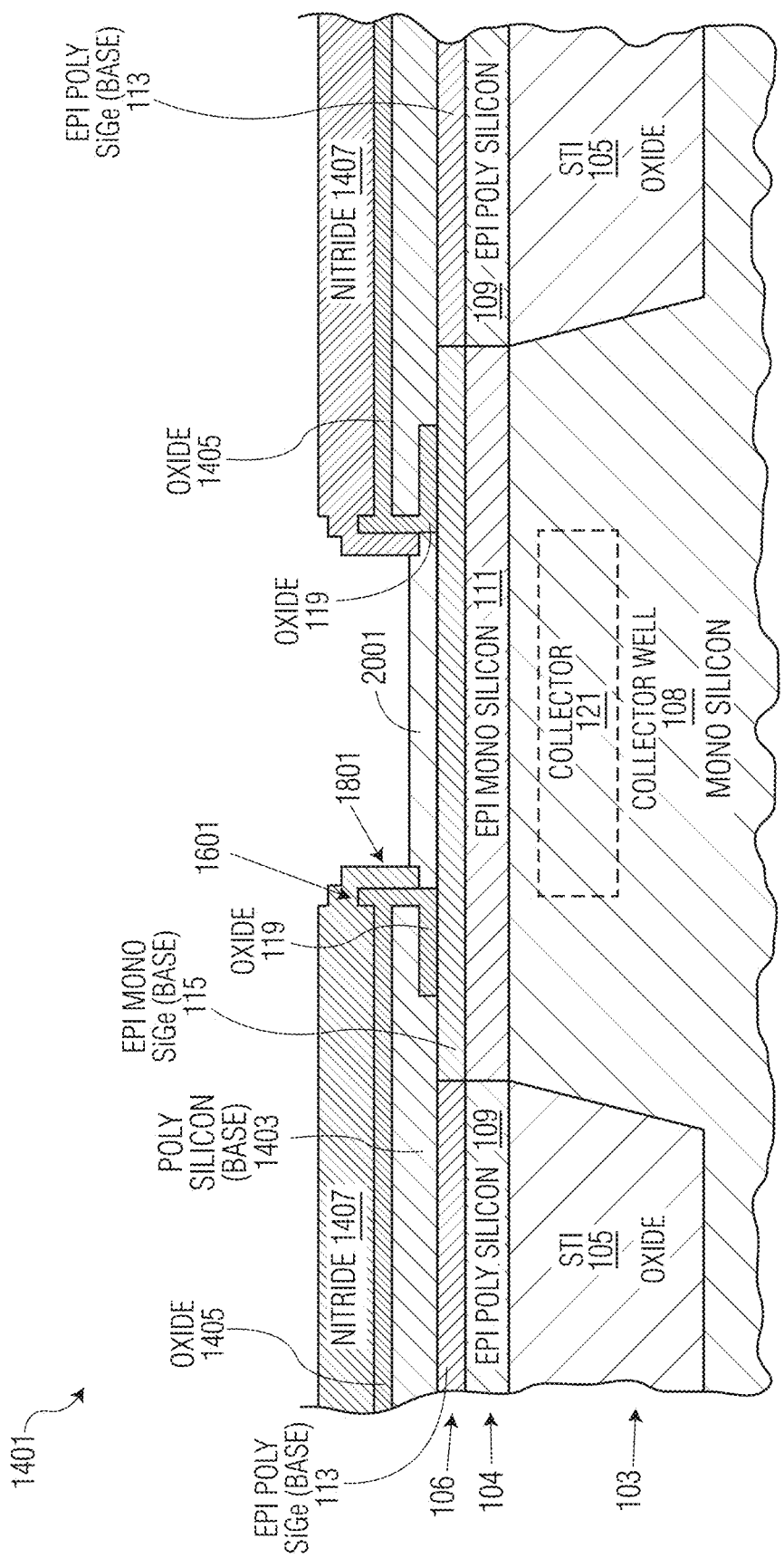

FIG. 20 is a partial cutaway side view of wafer 1401 after a sealing process is performed to form a silicon capping layer 2001 on portion 115. In one embodiment, caping layer 2001 is formed by a selective epitaxial growth process where cap layer 2001 is a monocrystalline silicon layer. Cap layer 2001 is grown to a level that is just above the bottom of spacer 1801 to seal the oxide of pad 119 and spacer 1601.

Figure 21:
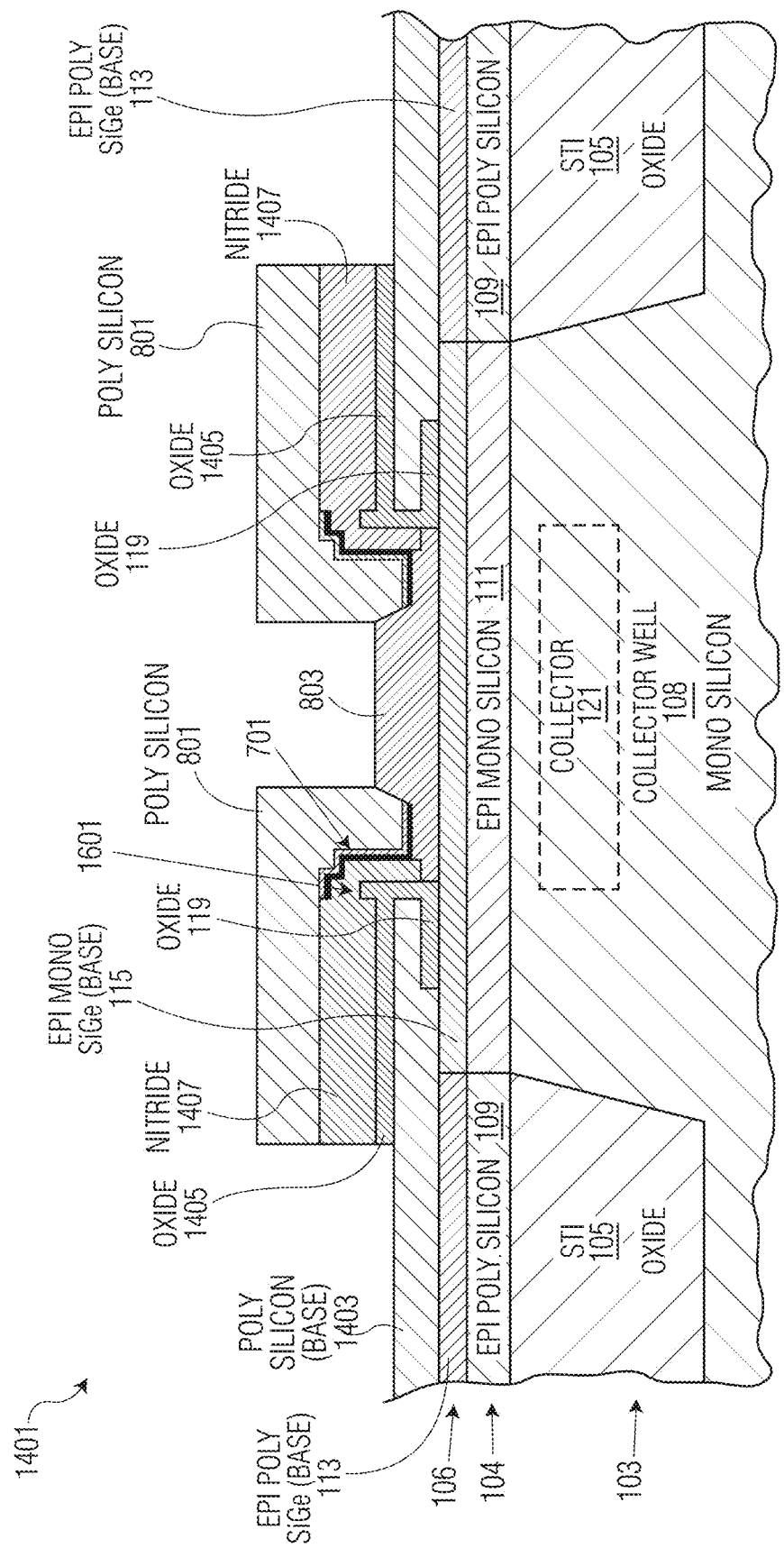

FIG. 21 is a partial cutaway side view of wafer 1401 after emitter window spacer 701, intrinsic mono silicon emitter portion 803, and poly silicon emitter electrode portion 801 are formed and portion 801 is patterned (along with nitride layer 1407 and oxide layer 1405) to form an emitter electrode. See the discussion of FIGS. 8 and 9 above regarding the formation of these structures. As a result of the patterning of portion 801, layer 1407, and layer 1405, portions of base poly silicon layer 1403 are exposed.

Figure 22:
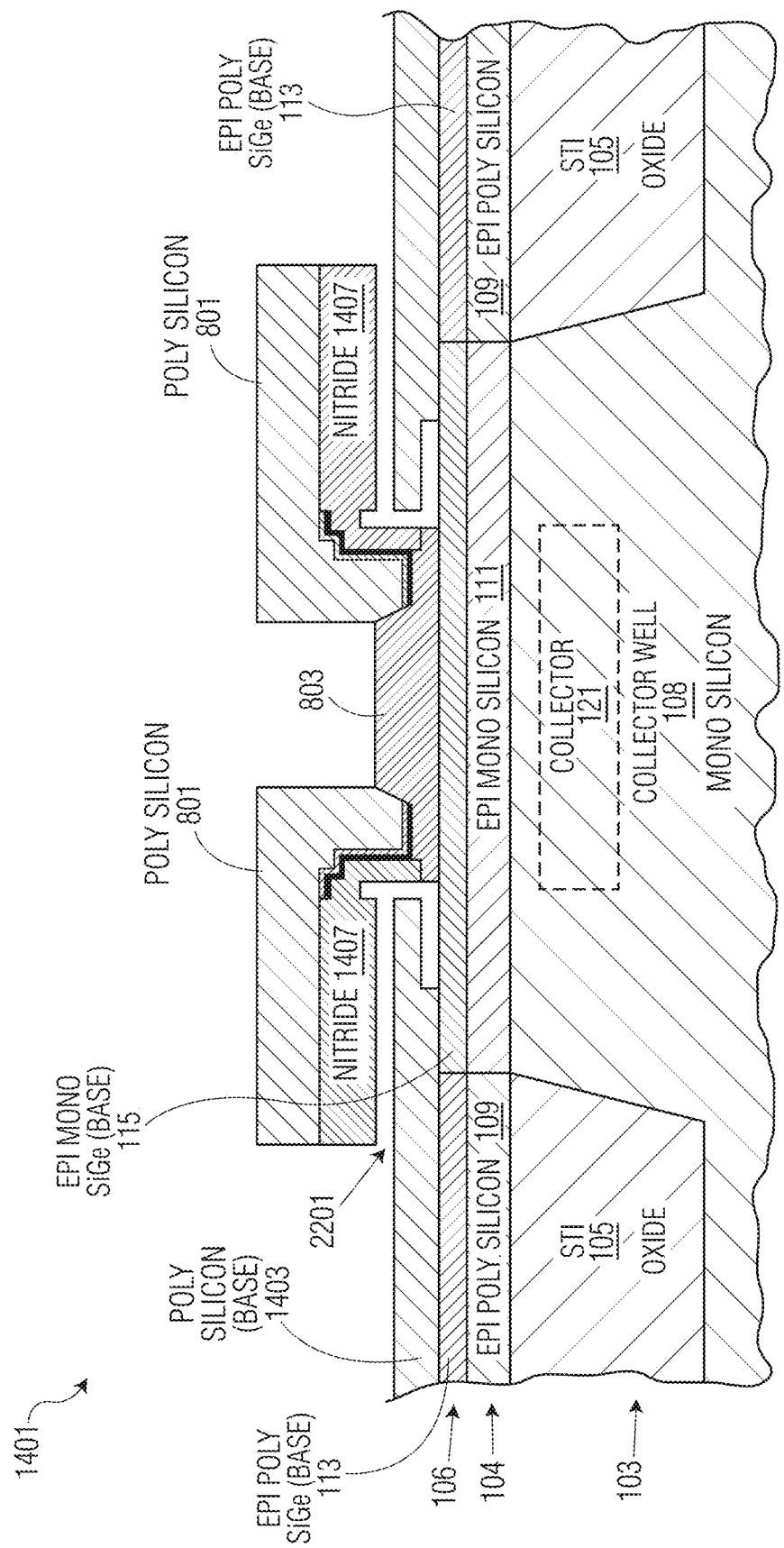

FIG. 22 is a partial cutaway side view of wafer 1401 after wafer 1401 is subject to an isotropic etch to remove the oxide material from pad 119, oxide spacer 1601, and oxide layer 1405. As a result of the etch, a surface on mono SiGe portion 115 is exposed.

Figure 23:
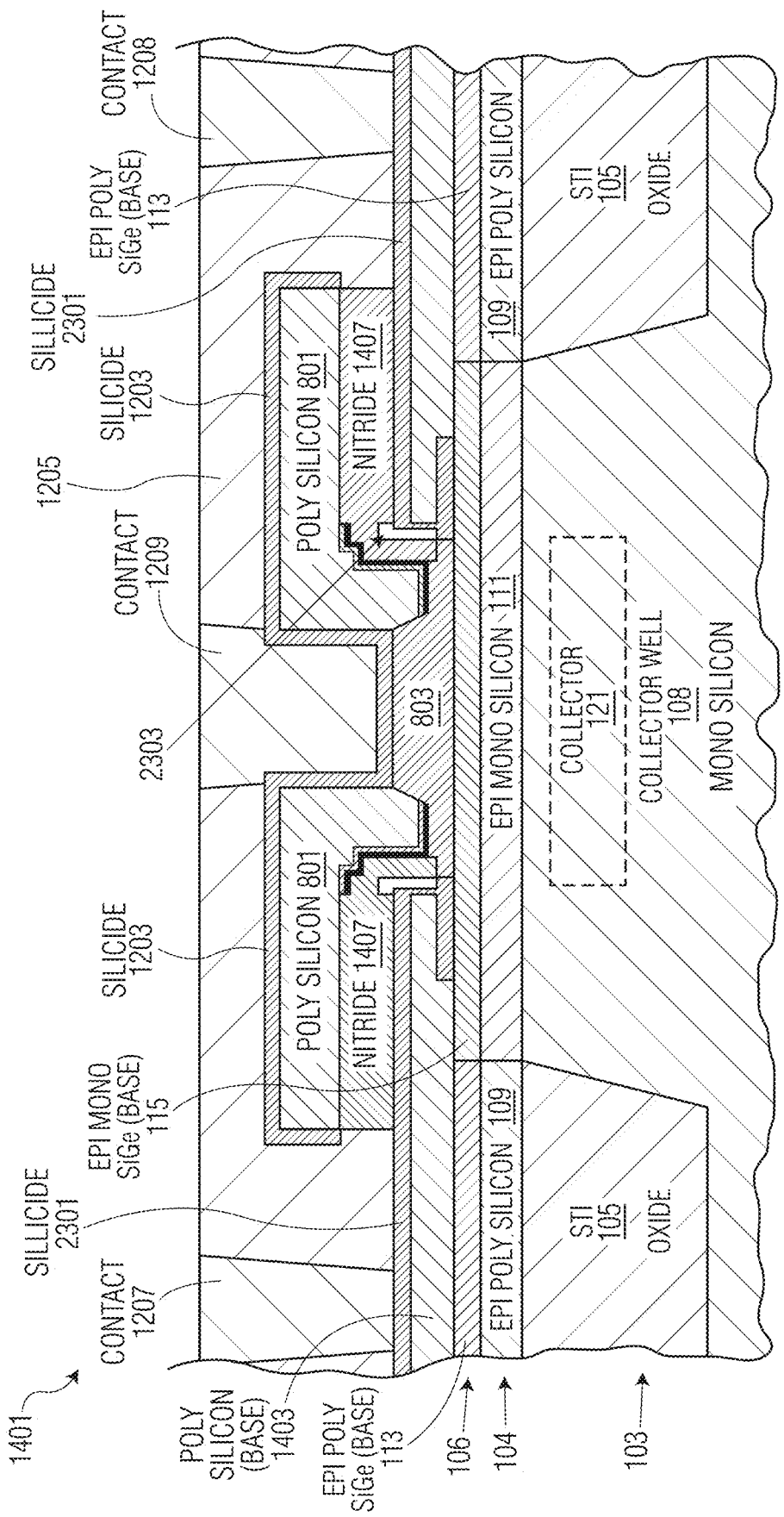

FIG. 23 is a partial cutaway side view of wafer 1401 after emitter silicide 1203 and base silicide 2301 are formed on the exposed surfaces of wafer 1401 that contain silicon. As shown in FIG. 23, base silicide 2301 is formed on a top, side and bottom surfaces of poly base layer 1403 and on a top surface of mono SiGe portion 115. In the embodiment shown, a cavity 2303 is formed at some locations where the oxide of pad 119, oxide spacer 1601, and oxide layer 1405 were removed.

FIG. 23 also shows wafer 1401 after dielectric material 1205 is formed. After the formation of dielectric material 1205, base contacts 1207 and 1208 are formed to electrically contact base silicide 2301 and emitter contact 1209 is formed to electrically contact emitter silicide 1203. See the discussion above regarding FIGS. 11-12 for further details on the formation of silicides and contacts. Afterwards, further processes may be performed on wafer 1401.

Figure 24:
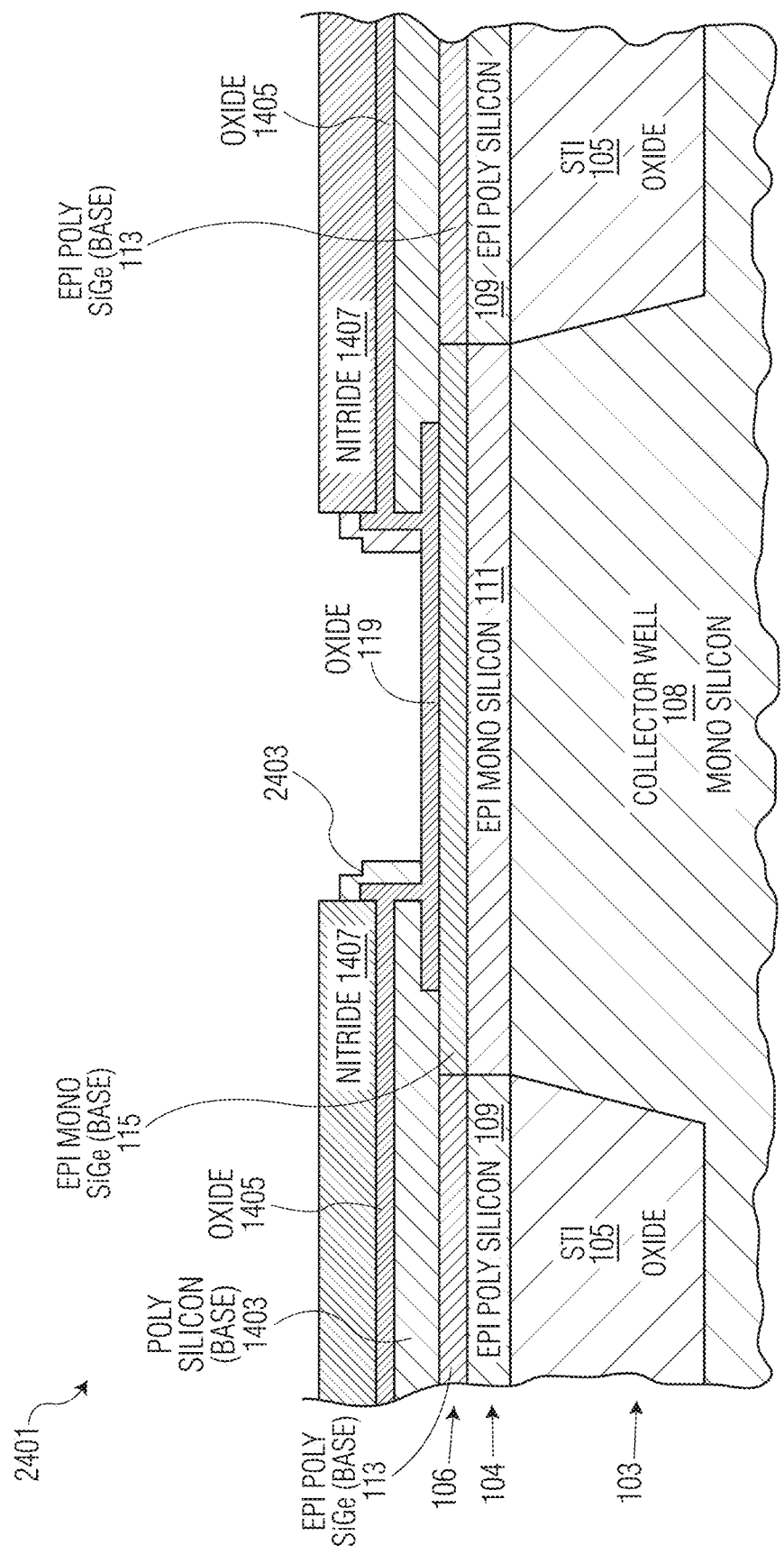
FIGS. 24-26 are partial cutaway side views of a wafer during various stages in the manufacture of a semiconductor device according to another embodiment of the present invention.
Figure 25:
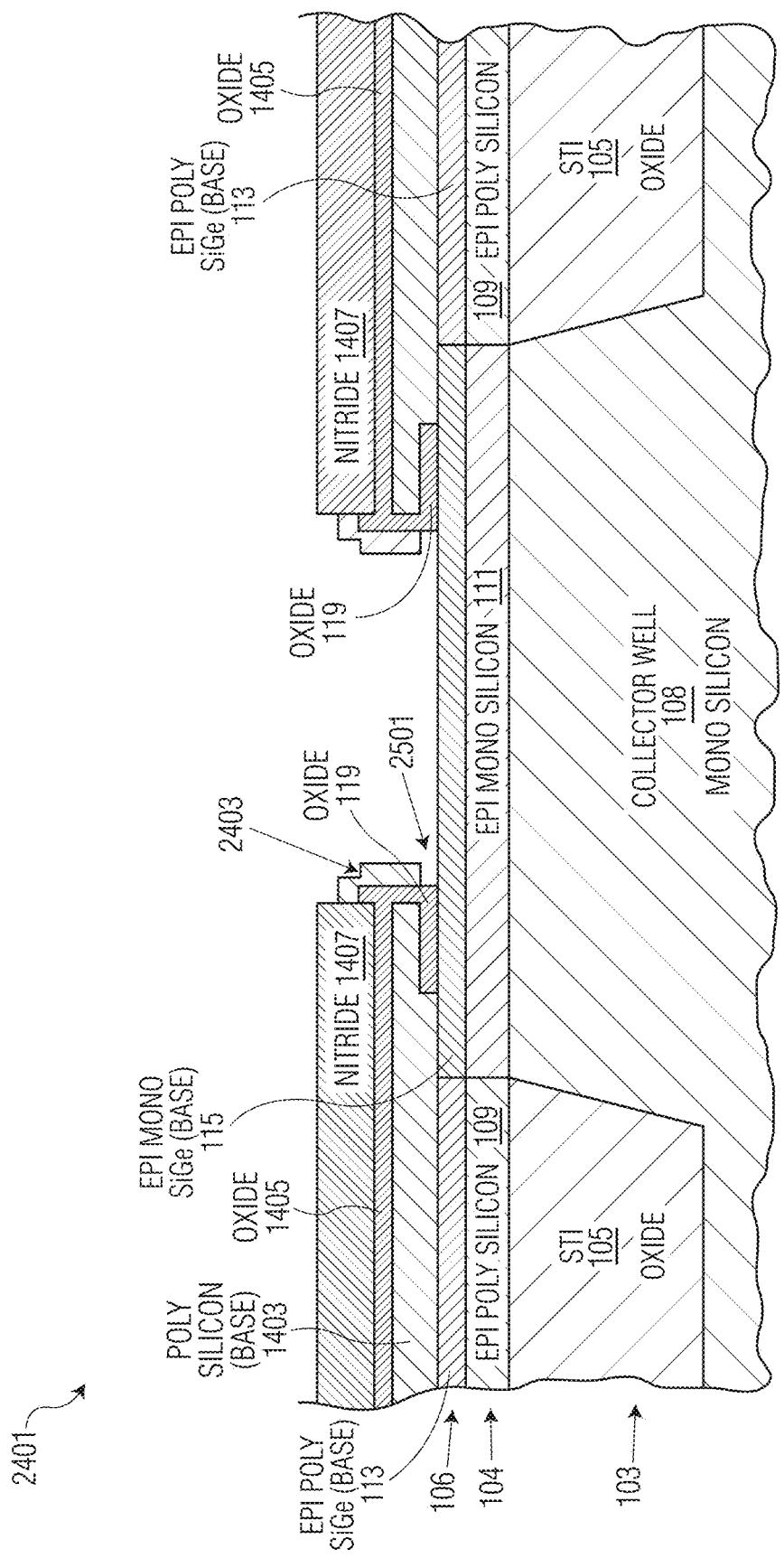
Figure 26:
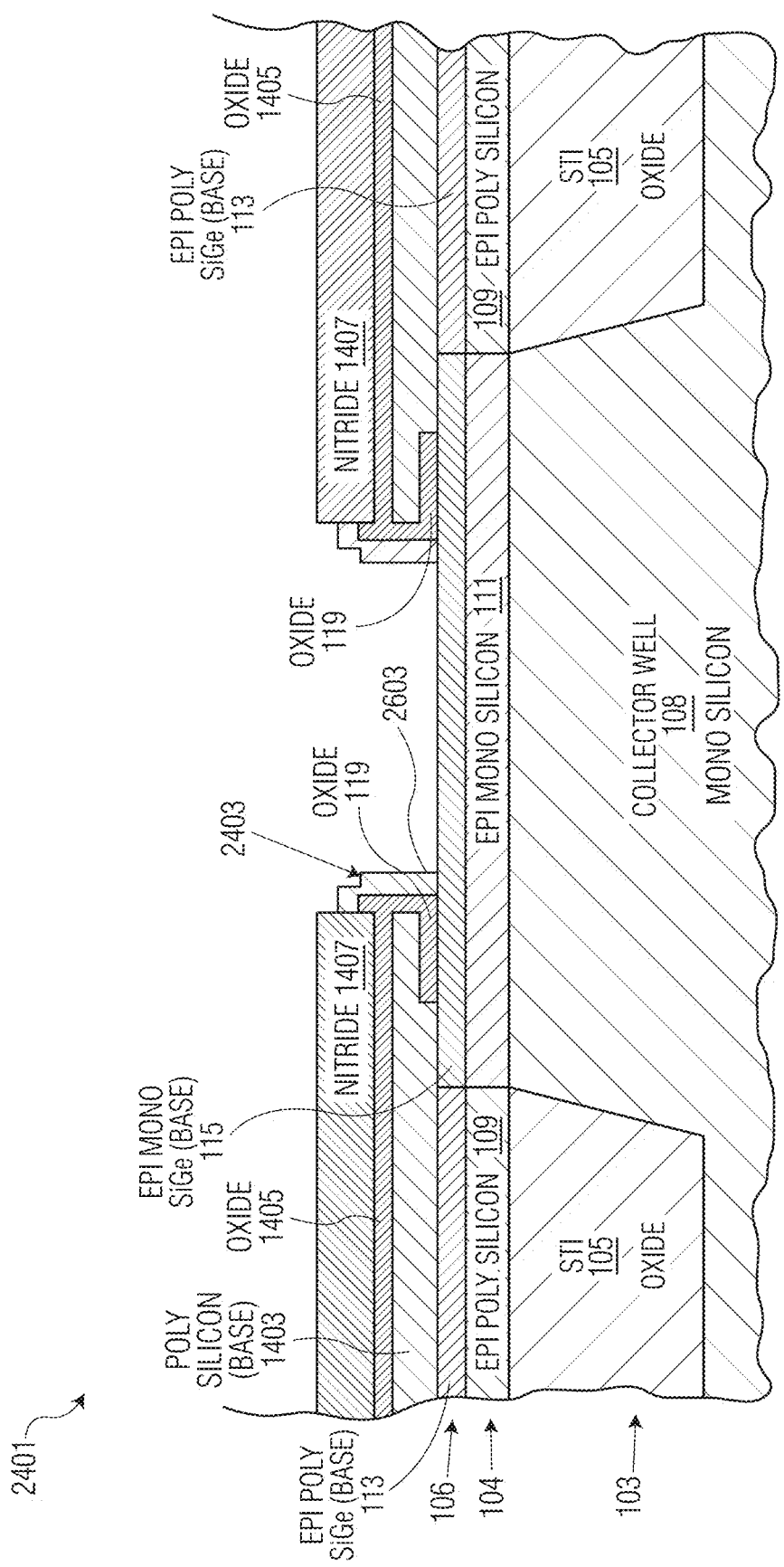

FIGS. 24-26 are a partial cutaway side views of a wafer 2401 during stages in its manufacturer according to another embodiment. The stages of FIGS. 24-26 shows an alternative embodiment to processes of FIGS. 14-23 where structures having the same references numbers as earlier embodiments are similar. FIGS. 24-26 are subsequent stages to the stage of FIG. 17 and show an alternative process for sealing the oxide material from the emitter window opening 401.

As shown in FIG. 24, after the removal of plug 1701 in FIG. 17, a polysilicon spacer 2403 is formed on wafer 2401. Spacer 2403 is formed by depositing a layer of poly silicon (not shown) on wafer 2401 followed by an anisotropical etch of the layer.

As shown in FIG. 25, wafer 2401 is subject to an isotropic etch to remove a portion of pad 119 including at location 2501 under spacer 2403.

FIG. 26 shows where semiconductor material 2603 is formed by subjecting wafer 2401 to a low temperature anneal in a hydrogen ambient, facilitating silicon atom mobility from spacer 2403 and SiGe portion 115 to seal exposed portions of pad 119. Afterwards, other processer may be formed on wafer 2401 including the formation of a base silicide at the location of pad 119. See the discussion above regarding the previous embodiments for further processes.

FIGS. 27-32 show various stages in the manufacture of a transistor according to another embodiment of the present invention.

Figure 27:
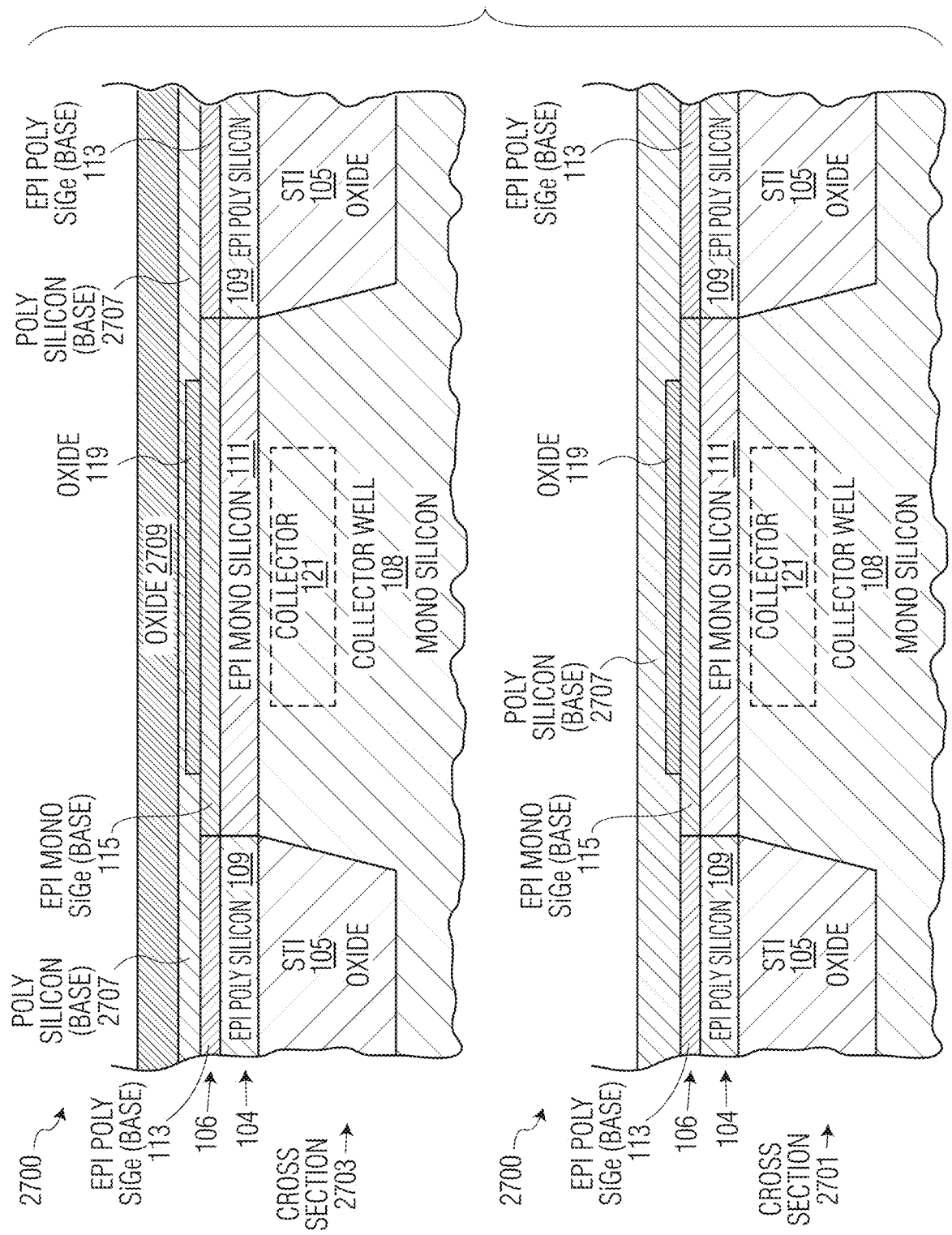
Figure 28:
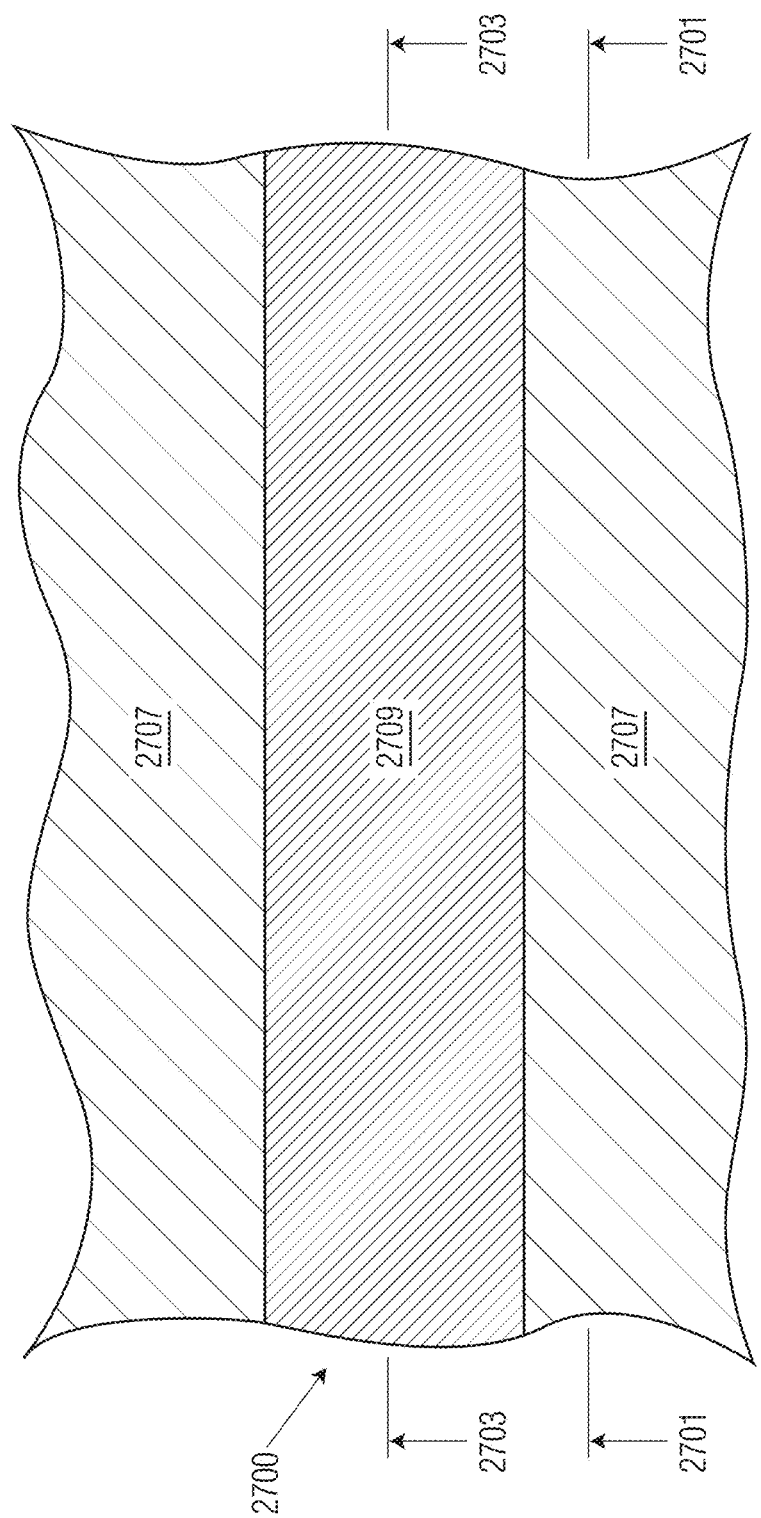

FIG. 27 shows two different partial cutaway side views (cross sections 2701 and 2703) of wafer 2700. FIG. 28 shows a top view of wafer 2700 showing the locations of cross section 2701 and 2703. FIG. 27 shows a stage in manufacture of a transistor that occurs after the stage in FIG. 1. Structures having the same references numbers are similar to those is previous embodiments.

After the stage of FIG. 1, a polysilicon base layer 2707 is deposited over wafer 2700 including over layer 106 and oxide pad 119. Afterwards, a patterned trench is selectively formed in a region of layer 2707 that includes the location of cross section 2703. The trench is then filled with oxide and planarized to form oxide layer 2709. See FIG. 28 for the location of the trench as shown by the location of oxide layer 2709. In some embodiments, the trench may contact pad 119 wherein oxide layer 2709 would contact pad 119 after oxide fill.

Figure 29:
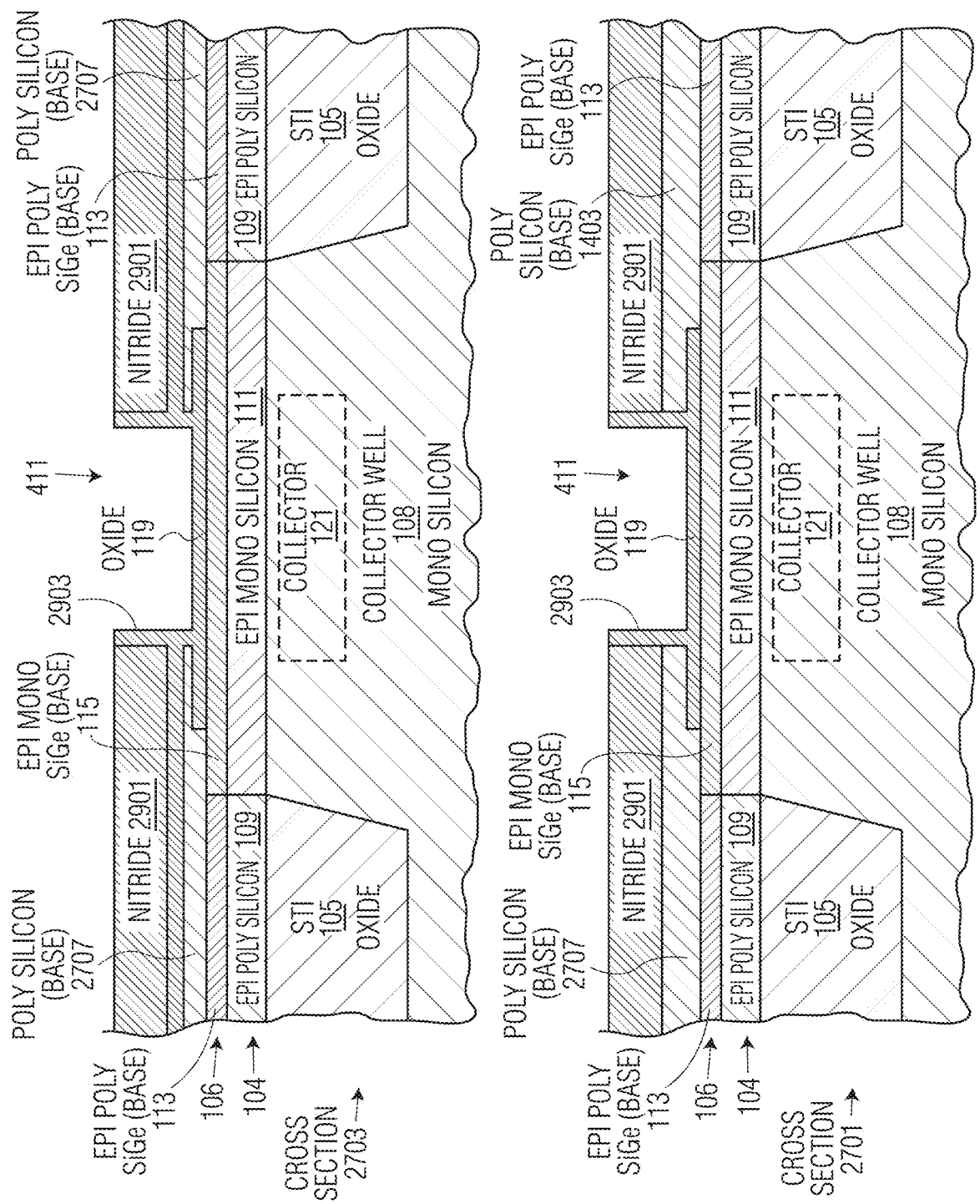

FIG. 29 shows a stage after an emitter window 411 is formed to expose pad 119 and after an oxide sidewall spacer 2903 is formed on the side of the emitter window 411. Oxide spacer contacts oxide layer 2709 in cross section 2703.

Figure 30:
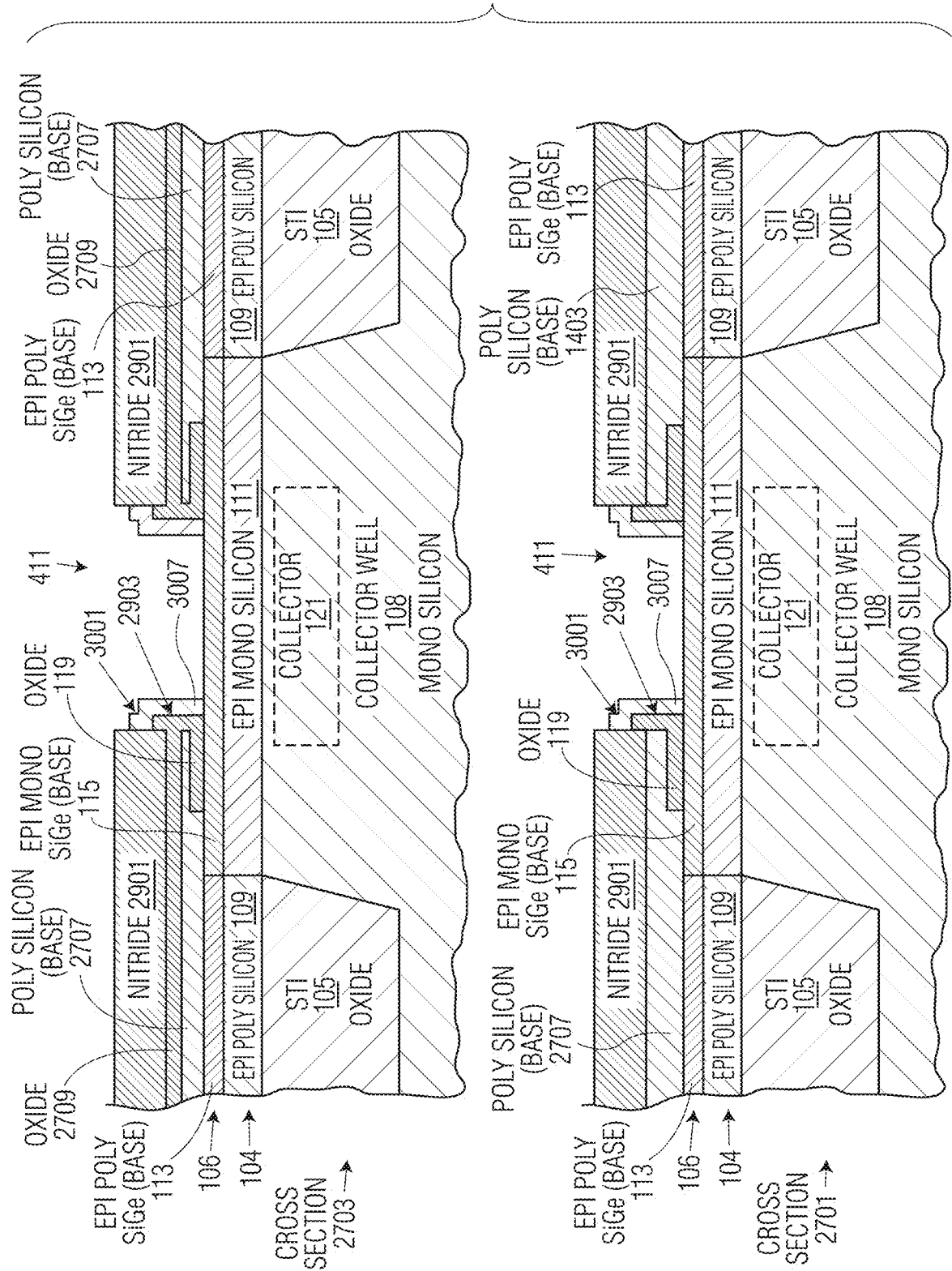

FIG. 30 shows wafer 2700 after spacer 2903 has been reduced in height and poly spacer 3001 is formed to cover spacer 2903. Afterwards, a portion of pad 119 is removed. Silicon material 3007 is formed below spacer 3001 to seal oxide spacer 2903 and pad 119. Silicon material 3007 is formed below spacer 3001 by subjecting wafer 2700 to a low temperature anneal in a hydrogen ambient, facilitating silicon atom mobility from spacer 3001 and SiGe portion 115 to seal exposed portions of pad 119. See the discussion above regarding FIGS. 24-26 for further details on this process.

In other embodiments, oxide spacer 2903 and the remaining portion of pad 119 may be sealed with a nitride spacer (see the discussion above regarding FIG. 13) or by epitaxially growing a silicon cap layer (see the discussion of FIGS. 18-20 above).

Figure 31:
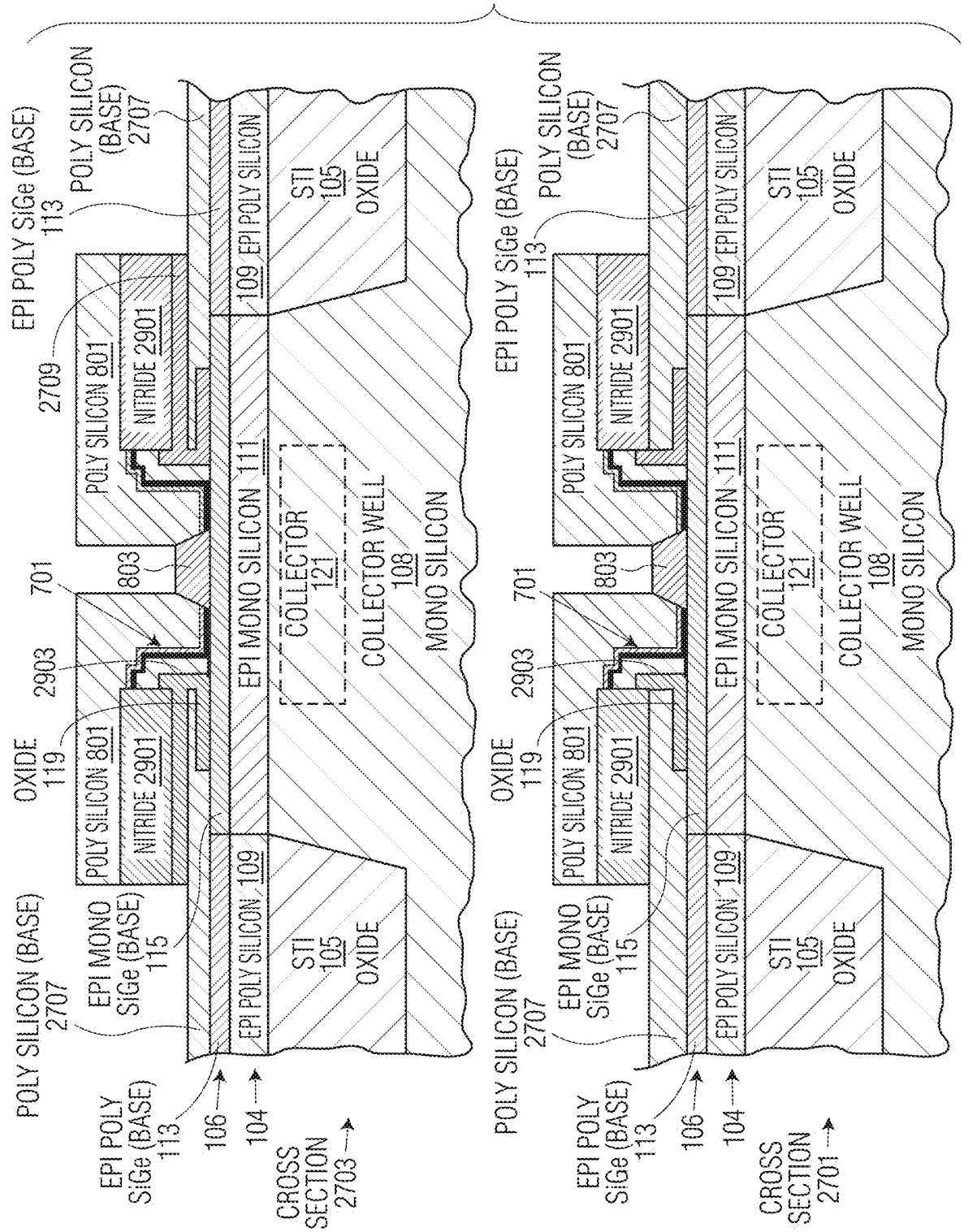

FIG. 31 shows cross sections 2701 and 2703 after emitter window spacer 701, intrinsic mono silicon emitter portion 803, and poly silicon emitter electrode portion 801 are formed and portion 801 is patterned to form an emitter electrode. Patterned along with portion 801 are nitride layer 2901 and oxide layer 2709 (located in cross section 2703) to expose the top of poly silicon layer 2707. See the discussion above regarding the formation of these structures in earlier embodiments.

FIG. 32 shows cross sections 2701 and 2703 after wafer 2700 is subject to an isotropic etch to remove the exposed oxide material from pad 119, oxide spacer 2903, and oxide layer 2709 to form opening 3201. As a result of the etch, a surface on mono SiGe portion 115 is exposed.

As shown in FIG. 32, the portion of the opening 3201 formed in cross section 2703 from the removal of oxide layer 2709 allows for the portion of pad 119 and spacer 2903 to be removed in the portion of wafer 2700 that did not include layer 2709 as shown in Section 2701. In some embodiments, this may allow for a portion of the transistor to be formed without forming a "cantilever" emitter electrode/nitride portion of emitter portion 801 and nitride layer 2901 as shown in cross section 2703 from the removal of layer 2709. Providing a portion of the transistor without the cantilever structure may reduce the probability of structural breakage during subsequent wafer processing.

In some embodiments, a transistor may be made with multiple narrower trenches in poly silicon layer 2707 that are similar to the trench of oxide layer 2709 where the multiple trenches are spaced apart across the transistor to allow for access of the etchant to all parts of pad 119 and spacer 2903 for removal.

After the stage of FIG. 32, silicide (not shown) is formed on all exposed silicon containing structures of wafer 2700 including on poly silicon base layer 2707 and portion 115 to form a base silicide and on emitter portions 801 and 803 to form an emitter silicide. After a layer of dielectric material (not shown) is formed over wafer 2700, contacts (not shown) are made to the emitter silicide and base silicide. See FIGS. 11 and 12 above. Afterwards, further processes may be performed on wafer 2700.

Forming trenches in the polysilicon layer and then depositing oxide in those trenches may be implemented in the other embodiments described herein such as with the embodiment of FIGS. 1-12, the embodiment of FIG. 13, the embodiment of FIGS. 14-23, and the embodiment of FIG. 24-26.

As shown herein, providing processes that form a sacrificial layer such as an oxide on a mono crystalline base material may allow for the subsequent formation of a portion of a base silicide that that electrically contacts the mono crystalline base layer which contains the intrinsic emitter. This may allow for a silicided path from the base contact to the monocrystalline layer which lowers the resistance from the base contact to the intrinsic base.

The transistors describe herein may have other configurations, have other structures, be made of other materials, and/or may be made by other processes. For example, FIGS. 12 and 23 each show an NPN bipolar transistor, however, other types of transistors may be made by the processes described herein. For example, a PNP transistor may be formed where the collector and emitter have a net P-type conductivity doping and the base has a net N-type conductivity doping.

As disclosed herein, a first structure is "directly over" a second structure if the first structure is located over the second structure in a line having a direction that is perpendicular with a generally planar major side of the wafer or substrate. For example, in FIG. 12, silicide 1203 is directly over silicide 1201. Portion 803 is not directly over STI 105. As disclosed herein, a first structure is "directly beneath" or "directly under" a second structure if the first structure is located beneath the second structure in a line having a direction that is perpendicular with a generally planar major side of the wafer or substrate. For example, in FIG. 12, portion 111 is directly beneath silicide 1203. Portion 115 is not directly beneath contact 1207. One structure is "directly between" two other structures in a line if the two structures are located on opposite sides of the one structure in the line. For example, in FIG. 12, nitride layer 305 is located directly between contacts 1207 and 1209 in a line in the cut away side view of FIG. 12. Collector region 121 is not located directly between contacts 1207 and 1208. A first structure is "directly lateral" to a second structure if the first structure and second structure are located in a line having a direction that is parallel with a generally planar major side of the wafer or substrate. For example, emitter contact 1209 and base contact 1207 are directly lateral to each other. One structure is "directly laterally between" two other structures if the two structures are located on opposite sides of the one structure in a line that is parallel with a generally planar major side of the wafer or substrate. For example, in FIG. 12, nitride layer 305 is located directly laterally between base contact 1207 and emitter contact 1209. A surface is at a "higher elevation" than another surface, if that surface is located closer to the top of the active side of a wafer or die in a line having a direction that is perpendicular with the generally planar major side of the wafer or die. In the views of FIGS. 1-12, the active side of the wafer is the top side of the Figures. For example, contact 1209 is at a higher elevation than portion 115.

Features specifically shown or described with respect to one embodiment set forth herein may be implemented in other embodiments set forth herein. For example, the specific sealing processes disclosed with respect to one embodiment, may be implemented in another embodiment.

In one embodiment, a method for forming a transistor includes forming a collector of a transistor and forming a base of the transistor. The base includes a monocrystalline base layer. The method includes forming an emitter of the transistor, forming a sacrificial material in contact with the monocrystalline base layer, removing at least a portion of the sacrificial material, and forming a base silicide. The forming the base silicide includes forming at least a portion of the base silicide on a portion of the monocrystalline base layer exposed by the removing.

In another embodiment, a method of forming a transistor includes forming a sacrificial material over a monocrystalline base layer, forming an emitter electrode material over sacrificial material, and patterning the emitter electrode material to form a patterned emitter structure. The method includes after the patterning the emitter electrode material, removing the sacrificial material from at least a portion of the monocrystalline base layer. The method includes forming a base silicide. The forming the base silicide includes forming at least a portion of the base silicide on a portion of the monocrystalline base layer exposed by the removing. The patterned emitter structure is located directly over at least a portion of the portion of the monocrystalline base layer exposed by the removing.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method for forming a transistor, the method comprising:
    forming a collector of a transistor;
    forming a base of the transistor, the base including a monocrystalline base layer;
    forming an emitter of the transistor;
    forming a sacrificial material in contact with the monocrystalline base layer;
    removing at least a portion of the sacrificial material;
    after forming the emitter, forming a base silicide, the forming the base silicide includes:
        forming at least a portion of the base silicide on a portion of the monocrystalline base layer exposed by the removing.

2. The method of claim 1 further comprising:
    forming a first layer directly over the sacrificial material and directly over the monocrystalline base layer prior to the removing;
    wherein the forming the emitter includes forming an emitter opening in the first layer, wherein the method includes removing a portion of the sacrificial material through the emitter opening prior to the removing at least a portion of the sacrificial material.

3. The method of claim 2 wherein:
    wherein the removing the portion of the sacrificial material through the emitter opening forms a sidewall of a remaining portion of the portion of sacrificial material;
    the method includes sealing the sidewall prior to the removing at least the portion of the sacrificial material.

4. The method of claim 3 wherein the sealing includes sealing with a semiconductor material.

5. The method of claim 1 further comprising:
    forming a base contact structure, wherein the base contact structure is in electrical contact with the base silicide.

6. The method of claim 5 wherein the base silicide includes a silicided path from the base silicide in electrical contact with the base contact structure to the base silicide on the portion of the monocrystalline base layer exposed by the removing.

7. The method of claim 1 wherein the forming the base silicide includes:
    forming a portion of the base silicide on a portion of polycrystalline base material, wherein the base contact structure is located directly over the portion of the base silicide formed on a portion of polycrystalline base.

8. The method of claim 7 wherein the polycrystalline base material is located in a layer that is located directly above the monocrystalline base layer.

9. The method of claim 7 wherein the polycrystalline base material is located in a base polycrystalline layer wherein the removing step includes removing material on a sidewall of the base polycrystalline layer, wherein the forming the base silicide includes forming a portion of the base silicide on the sidewall.

10. The method of claim 1 further comprising:
prior to the removing, forming a polycrystalline base layer located directly over the portion of the monocrystalline base layer that will be exposed by the removing;
forming a trench in the polycrystalline base layer and filling the trench with a first material, wherein the trench is located laterally apart from an area directly over a portion of the portion of the monocrystalline base layer that will be exposed by the removing.

11. The method of claim 10 wherein the removing includes removing at least a portion of the first material to access the sacrificial material to remove the sacrificial material.

12. The method of claim 1 wherein the monocrystalline base layer includes a least a portion of an intrinsic base of the transistor.

13. The method of claim 1 wherein forming the emitter includes forming a patterned emitter electrode structure, the patterned emitter electrode structure is located directly over at least a portion of the portion of the monocrystalline base layer exposed by the removing.

14. The method of claim 13, wherein the patterned emitter electrode structure is patterned prior to the removing.

15. The method of claim 1 wherein the monocrystalline base layer is characterized as a silicon germanium layer.

16. The method of claim 1 wherein the transistor is characterized as a heterojunction bipolar transistor.

17. A method for forming a transistor, the method comprising:
forming a collector of a transistor;
forming a base of the transistor, the base including a monocrystalline base layer;
forming an emitter of the transistor;
forming a sacrificial material in contact with the monocrystalline base layer;
removing at least a portion of the sacrificial material;
forming a base silicide, the forming the base silicide includes:
forming at least a portion of the base silicide on a portion of the monocrystalline base layer exposed by the removing;
forming an emitter silicide on the emitter simultaneously with forming the base silicide.

18. A method of forming a transistor comprising:
forming a sacrificial material over a monocrystalline base layer;
forming an emitter electrode material over sacrificial material;
patterning the emitter electrode material to form a patterned emitter structure;
after the patterning the emitter electrode material, removing the sacrificial material from at least a portion of the monocrystalline base layer;
forming a base silicide, the forming the base silicide includes:
forming at least a portion of the base silicide on a portion of the monocrystalline base layer exposed by the removing;
wherein the patterned emitter structure is located directly over at least a portion of the portion of the monocrystalline base layer exposed by the removing.

19. The method of claim 18 further comprising:
forming a base contact structure in electrical contact with the base silicide;
wherein the base silicide includes a silicided path from the base silicide in electrical contact with the base contact structure to the base silicide on the portion of the monocrystalline base layer exposed by the removing.

20. The method of claim 19 wherein the base contact structure is formed directly over a portion of the base silicide formed on a polycrystalline base layer.

* * * * *